United States Patent [19]

Moosa et al.

[11] Patent Number: 5,822,218
[45] Date of Patent: Oct. 13, 1998

[54] SYSTEMS, METHODS AND COMPUTER PROGRAM PRODUCTS FOR PREDICTION OF DEFECT-RELATED FAILURES IN INTEGRATED CIRCUITS

[75] Inventors: Mohamed S. Moosa, Austin, Tex.; Kelvin F. Poole, Clemson, S.C.

[73] Assignee: Clemson University, Clemson, S.C.

[21] Appl. No.: 703,518

[22] Filed: Aug. 27, 1996

[51] Int. Cl.[6] .................................................. G06F 17/50
[52] U.S. Cl. ...................... 364/488; 364/468.28; 364/578
[58] Field of Search ..................................... 364/488, 489, 364/490, 491, 578, 468.28

[56] References Cited

PUBLICATIONS

Meeker et al., "An Accelerated Life Test Model Based on Reliability Kinetics", Technometrics, vol. 37, No. 2, May 1995, pp. 133–146.
Smy et al., "Simulation and Analysis of Electromigration Failure Distributions", Microelecron. Reliabl., vol. 34, No. 6, 1994, pp. 1047–1056.
Hunter, "Gate Oxide Reliability: The Use of Simulation to Quantify Important Aspects of Lifetime Projection from TDDB Data", 1994 IRW Final Report, 1994, pp. 95–103.
Ishizuka et al., "Photon Emission Study of ESD Protection Devices Under Second Breakdown Conditions", IEEE/IRPS, 1994, pp. 286–291.
Papp, "Simple Mixture Model of Reliability With Manufacturing Defects", Reliability Review, vol. 14, No. 1, Mar. 1994, pp. 10–13.
Menon et al., "Subpopulation Model for Void–Related Early Failure in VLSI Interconnects", SPIE, vol. 2334, 1994, pp. 23–34.
Moosa et al., "Reliability Stimulator for Improving IC Manufacturability", SPIE, vol. 2334, 1994, pp. 287–294.
Quader et al., "Hot–Carrier Reliability Design Guidelines for CMOS Logic Circuits", IEEE 1993 Custom Integrated Circuits Conference, pp. 30.7.1–30.7.4.
Huston, "Reliability Defect Detection and Screening During Processing—Theory and Implementation", IEEE/IRPS, 1992, pp. 268–275.
Hu, "The Berkeley Reliability Simulator BERT: An IC Reliability Simulator", Microelectronics Journal, V. 233, No. 2, Apr. 1992, pp. 97–102.
Hu, "IC Reliability Simulation", IEEE Journal of Solid-State Circuits, vol. 27, No. 3, Mar. 1992, pp. 241–246.
Hu, "IC Reliability Simulation (Invited Paper)", IEEE 1991 Custom Integrated Circuits Conference, pp. 4.1.1–4.1.4.

(List continued on next page.)

*Primary Examiner*—Emanuel Todd Voeltz
*Assistant Examiner*—Leigh Marie Garbowski
*Attorney, Agent, or Firm*—Myers Bigel Sibley & Sajovec

[57] ABSTRACT

Systems, methods and computer program products for predicting defect-related failures in integrated circuits produced by an integrated circuit fabrication process identify objects in a circuit layout for the integrated circuit design, each object having a location in the circuit layout and a reliability connectivity in the integrated circuit design. Sample object defects are generated for the identified objects, each sample object defect representing a defect produced in an object by the integrated circuit fabrication process and having a defect magnitude associated therewith. An accelerated life defect influence model is identified for each sample object defect, relating the lifetime of an object to the defect magnitude of a defect in the object. Sample object lifetimes are generated from the defect magnitudes associated with the sample object defects according to the corresponding identified accelerated life defect influence models. A prediction of the reliability of integrated circuits is generated from the sample object lifetimes according to the reliability connectivity of the associated objects in the integrated circuit design. Preferably, the accelerated life defect influence models include log-linear regression models, which may include deterministic object lifetime functions, each relating the defect magnitude of the at least one sample object defect to one object lifetime value, and log-linear object lifetime distributions, each relating the defect magnitude of a sample object defect to a plurality of object lifetime values.

73 Claims, 11 Drawing Sheets

OTHER PUBLICATIONS

Trindade, "*Can Burn–In Screen Wearout Mechanisms?: Reliability Modeling of Defective Subpopulations—A Case Study*", IEEE/IRPS, 1991, pp. 260–263.

Lloyd et al., "*The Electromigration Failure Distribution: The Fine–Line Case*", J. Appl. Phys., V. 69, No. 4, Feb. 15, 1991, pp. 2117–2127.

Stevenson et al., "*Microelectronics Reliability Predictions Derived from Component Defect Densities*", 1990 Proceedings Annual Reliability and Maintainability Symposium, pp. 366–371.

Burnett et al., "*Bipolar Circuit Reliability Simulation*", IEDM, 1990, pp. 181–184.

Moazzami, "*Projecting Gate Oxide Reliability and Optimizing Reliability Screens*", IEEE Transactions on Electron Devices, vol. 37, No. 7, Jul. 1990, pp. 1643–1650.

Kemp et al., "*The Effects of Defects on the Early Failure of Metal Interconnects*", IEEE Transactions on Reliability, vol. 39, No. 1, Apr. 1990, pp. 26–29.

Liew et al., "Reliability Simulator for Interconnect and Intermetallic Contact Electromigration", IEEE/IRPS, 1990, pp. 111–118.

Rosenbaum et al., "*Circuit Reliability Simulator—Oxide Breakdown Module*", IEDM, 1989, pp. 331–334.

Jensen, "*Component Failures Based on Flaw Distribution*", 1989 Proceedings Annual Reliability and Maintainability Symposium, pp. 91–95.

Frost et al., "*RELIANT: A Reliability Analysis Tool for VLSI Interconnects*", IEEE Journal of Solid–State Circuits, vol. 24, No. 2, Apr. 1989, pp. 458–462.

Lee et al., "*Modeling and Characterization of Gate Oxide Reliability*", IEEE Transactions on Electron Devices, vol. 35, No. 12, Dec. 1988, pp. 2268–2278.

Meeker, Jr., "*Limited Failure Population Life Tests: Application to Integrated Circuit Reliability*", Technometrics, vol. 29, No. 1, Feb. 1987, pp. 51–65.

Lawless, "*Miscellanea: A Note on Lifetime Regression Models*", Biometrika, vol. 73, No. 2, 1986, pp. 509–512.

Cox et al., "*Dependence on Explanatory Variables: Model Formulation*", Chapter 5, Analysis of Survival Data, Chapman and Hall, 1984, pp. 62–77.

Bobbio et al., "*Fast Algorithm for Unavailability and Sensitivity Analysis of Series–Parallel Systems*", IEEE Transactions on Reliability, vol. R–31, No. 4, Oct. 1982, pp. 359–361.

Farewell et al., "*A Study of Distributional Shape in Life Testing*", Technometrics, vol. 19, No. 1, Feb. 1977, pp. 69–75.

| Label | Available Data | | | | | Determine |
|---|---|---|---|---|---|---|
| | $F_i(t)$ | $F_d(t)$ | $f(\delta)$ | $T_o(\varsigma)$ | $F_G$ | |
| A | ✓ | | ✓ | | ✓ | $T_o(\varsigma)$ |
| B | | ✓ | ✓ | | | |
| C | | | ✓ | | ✓ | |
| D | ✓ | | | ✓ | ✓ | $f(\delta)$ |
| E | | ✓ | | ✓ | | |
| F | | | | ✓ | ✓ | |

SYSTEMS, METHODS AND COMPUTER PROGRAM PRODUCTS FOR PREDICTION OF DEFECT-RELATED FAILURES IN INTEGRATED CIRCUITS

FIELD OF THE INVENTION

The present invention relates to systems, methods and computer program products for integrated circuit (IC) design and fabrication, in particular, to systems, methods and computer program products for predicting the reliability of ICs.

BACKGROUND OF THE INVENTION

Integrated circuits (ICs) are omnipresent in today's electronic age, found in a wide variety of equipment, including household appliances, consumer electronics, communications systems, automotive systems, aircraft, and the like. As dependence on ICs has increased, the reliability of these devices has increasingly become an important concern. For example, an automotive manufacturer incorporating an IC in an engine control or antilock braking system wants to ensure that the hundreds of thousands of units put into the field will operate reliably without producing an undesirably high number of failures which may threaten safety or force an expensive recall. Similarly, the operators of a satellite communications system want to ensure that the failure of a relatively inexpensive IC will not lead to a crippling failure of a critical satellite or other network component, resulting in costly downtime and other losses.

A measure of the reliability of an IC is the failure rate of the IC, which may be defined as the instantaneous rate of failure at a time t, for ICs that have survived to the time t. As illustrated in FIG. 1, a widely used model of IC failure has a distinctive characteristic which has lead to the classification of IC failures into three distinct types. An early failure or "infant mortality" regime is characterized by an initially high but rapidly decreasing failure rate. For times beyond this early failure period, a relatively low number of failures occur, corresponding to the normal life of the IC. As time proceeds, more failures begin to occur as a wearout period approaches wherein devices begin to fail in greater numbers due to long-term wearout phenomena.

Early in the history of the development of IC technology, wearout-related failures, sometimes referred to as "intrinsic failures," were an important concern because design and fabrication techniques were relatively unsophisticated. The intrinsic quality in IC's has improved dramatically, however, with design and manufacturing technology maturing to consistently produce systems with relatively high intrinsic reliability. Because of improvements in manufacturing techniques and the tendency of modern integrated circuit products to have relatively short product cycles, wearout-related failures have generally become less of a concern, with the typical IC exhibiting wearout failure long after it has become obsolete. For this and other reasons, end users and manufacturers are increasingly focusing on the reduction of early failures, as fielding ICs with even relatively small infant mortality rates can have costly consequences.

Except for those failures that result from improper usage, or from anomalous, uncontrollable environmental factors, e.g. lethal electrostatic discharge, early failures may generally be attributed to the presence of randomly occurring defects that originate during fabrication of the IC. These defects may occur due to design, manufacturing and handling causes, and generally include any local manufacturing flaw that precipitates early failure, distinct from those flaws that are catastrophic, resulting in yield loss, and those that are benign, culminating in long-term wearout-related failure. Examples of defects which may lead to early failure include oxide pinholes, mask, photoresist or etch-related flaws that result in near opens or shorts, contaminants (e.g., mobile-ions), scratches, weak bonds, excessive mechanical stresses and the like, arising from manufacturing variations or practical limitations of the fabrication process and material control. Failures which arise from these defects are often referred to as "extrinsic failures."

Traditionally, burn-in has been used to cull potential IC early failures prior to deployment in the field. In high-reliability applications, burn-in typically is performed by applying stresses that accelerate IC failure due to specifically targeted mechanisms. For less critical applications, sample lots may be evaluated through burn-in to estimate an extrinsic failure rate for the IC. Statistical models applying these estimates have been developed and successfully applied to monitoring process outputs. However, burn-in generally is time-consuming and may require specialized equipment, both of which may make burn-in an expensive option. Burn-in may also be deleterious to product reliability if competing failure mechanisms are present and not properly accounted for, as the stresses applied to parts which survive burn-in may decrease their reliability once deployed in the field.

Recognizing the problems associated with burn-in or process output screening, "building-in reliability" and "designing-in reliability" strategies have been proposed. In a building-in approach, factors that impact reliability are isolated and controlled at stages of the integrated circuit fabrication process using, for example, statistical process control (SPC) techniques to ensure a reliable product. Typically, however, only large scale or systematic contributors to extrinsic failure are detected and managed; localized random defects that precipitate early failures may not be taken into account. In addition, the models employed generally encompass an empirically-determined set of process inputs specific to a production of a specific IC using a specific set of processes, making it difficult to apply these models/process inputs to other designs and to modify the models for given ICs as fabrication processes evolve. Moreover, only the relative effects of different inputs may be available; a precise quantification of their effects on eventual IC failure rate may not be possible.

Designing-in reliability approaches emphasize the development of generally applicable reliability prediction models for use in, for example, computer simulation tools which predict the reliability of ICs. Unfortunately, conventional simulation tools may not accurately simulate defect-related early failures. For example, conventional computer-aided-design (CAD) simulation tools typically predict intrinsic failure rates and merely extrapolate extrinsic failure rates from the intrinsic failure prediction. Tools that do address extrinsic failure prediction, for example, application-oriented subjective statistical models similar in spirit to the well-known models of Mil Hdbk-217, typically apply to whole classes of ICs produced in a given technology,. Although such models may be useful for predicting board and system level failures, and for tracking the reliability growth of a family of ICs from a given process line, they generally do not support IC design and fabrication process development.

Theoretical models have also been developed based on failure physics or defect-related failure statistics for certain structures within IC's. To manage the complexity inherent in reliability modeling, these techniques may partition an IC design into logical subsystems such as the metallization layers, gate oxides, bond pads, packaging, and the like. These subsystems may be further decomposed into elementary objects corresponding to physically realizable structures that are used to construct the IC, e.g., contacts, vias, metal runs, gate oxides, and the like. This hierarchical partitioning approach can provide an effective technique for ranking the impact of the various subsystems on overall system reliability, while simultaneously isolating object types, process steps and/or sub-circuits for further improvement.

Individual objects may be susceptible to various, possibly competing, failure mechanisms that manifest as different failure modes. For example, metal runs are known to be susceptible to failure due to electromigration, corrosion and stress-induced voiding, and failure may occur as an open or a short. The reliability of a subsystem may be assessed through the use of test structures for objects that may be grouped into sets of varying geometry, topography, material type, processing conditions and the like, in order to quantify the effects of these factors on the failure characteristics of the objects. The test object structures typically are subjected to well controlled stresses, e.g., thermal, mechanical, electrical and the like, designed to induce failure due to specific mechanisms. The resulting test data may be represented by a suitably parameterized cumulative distribution function (CDF), i.e. a function describing the probability that an object will fail under the given conditions at or before a time t. The reliability of an IC may be similarly specified and measured by defining a proper set of test conditions, and fitting a Cdf to the resulting data.

The inventors of the present invention have previously proposed an approach for predicting extrinsic failure which is based on assumptions that (1) the probability that an object $o_i$ has a defect $d_i$ is independent of probability of defects in other objects, and (2) the Cdf for an object can be modeled as a mixture of intrinsic and extrinsic Cdfs. See, "Reliability Simulator for Improving IC Manufacturability" by Moosa et al., in Microelectronics Manfacturability, Yield and Reliability, SPIE, Vol. 2334, October 1994. Let $T_o$ represent the lifetime of a test structure object o, subject to a set of stress conditions C. Since failure is a random event, $T_o$ is a random variable with a Cdf given by:

$$F_o(t)=Pr\{T_o \leq t\}. \quad (1)$$

In the absence of a defect, the object may be assumed to fail intrinsically with a lifetime $T_{oi}$, with the corresponding Cdf:

$$F_{oi}(t)=Pr\{T_{oi} \leq t\}. \quad (2)$$

For a defected object, two possibilities for the effect of the defect on $T_o$ may be considered. First, the failure mechanism associated with the defect may compete with an intrinsic failure mechanism, according to a "competing risks" model. In this model, the lifetime associated with failure due to the defect failure mechanism alone may be denoted $T_{of}$, with the Cdf for such a failure given by:

$$F_{of}(t)=Pr\{T_{of} \leq t\}. \quad (3)$$

Thus, assuming that the two failure mechanisms are mutually independent, then $$T_o=\min(T_{of}, T_{oi}), \quad (4)$$

or equivalently, $$F_o(t)=1-[1-F_{of}(t)][1-F_{oi}(t)]. \quad (5)$$

Alternatively, if the failure mechanisms are mutually independent and do not compete, a "subpopulation" model may apply, wherein:

$$T_o = \begin{cases} T_{o_d} & \text{if } o \text{ fails due to the defect} \\ T_{o_i} & \text{otherwise} \end{cases}, \quad (6)$$

or equivalently, $$F_o(t)=p_d F_{od}(t)+(1-p_d)F_{oi}(t), \quad (7)$$

where $p_d \equiv \Pr\{$object o is defected AND fails due to the defect$\}$. The object Cdf $F_o(t)$ conventionally is measured using test structures, and the intrinsic and extrinsic Cdfs are inferred by identifying subpopulations within the data for the object Cdf.

Without detailed failure analysis, it is often a matter of engineering judgement as to the circumstances whether the subpopulation or competing risks models is to be preferred. In addition, for defect-related failure, critical area may significantly affect measured object Cdfs. Since test structure objects and the corresponding "on-chip" objects rarely have the same critical areas, the effect of critical area may be related by:

$$F_o^{A2}(t)=1-[1-F_o^{A1}(t)]^{A2/A1}. \quad (8)$$

where $A_1$ and $A_2$ are the critical areas of two similar objects with Cdfs $F_o^{A1}(t)$ and $F_o^{A2}(t)$, respectively. Reliability prediction techniques based on object Cdfs typically assume that objects are exposed to the same type of defect with the same defect density per unit critical area, and that the failures in each disjoint unit of critical area are mutually independent. These techniques may use $F_o(t)$ to compute the IC Cdf, $F_G(t)$, by adjusting $F_o(t)$ to reflect "on-chip" stress conditions and object critical area. The probability that an object is defected can be estimated by Monte Carlo integration, and this probability used to simulate chip reliability by assuming that every object of the same type would fail intrinsically according to $F_i(t)$ and extrinsically according to $F_d(t)$ However, there may be several problems associated with this approach. For a series system (IC) of M objects, all of the same type, the system Cdf may be given by:

$$F_G(t)=1-[1-F_o(t)]^M \quad (9)$$

For a computer simulation implementation, as M increases, the susceptibility to numerical roundoff error generally increases. This is especially the case when $F_d(t)$, $F_i(t)$ and $F_o(t)$ represent extremely rare events at the times of interest, which is typically the case when early defect-related failures are being predicted. For these times of interest, $p_d$ may also be small, such that the result obtained for $F_G(t)$ may not differ significantly from that computed by extrapolating $F_i(t)$ alone. Thus, lack of numerical precision may limit the accuracy of the simulation.

Another problem with this approach is that the times of interest often coincide with the "tails" of the Cdfs employed, i.e., regions that are generally not experimentally accessible without an inordinately large number of samples. Predictions in these regions may suffer from errors of extrapolation which may be strongly dependent on the type of distribution used. For example, the Weibull distribution has a heavier "tail" than the lognormal distribution, and is more sensitive to the distribution shape parameter the further one moves towards the extremities of the distribution. Thus, the choice of distribution form may introduce a significant element of subjectivity into the eventual result obtained for $F_G(t)$.

Another difficulty stems from the use of the F(t)'s as estimators of object Cdfs without allowing for the possible interactions between the test structure employed and the measured $P_d$, $F_d(t)$ and $F_t(t)$. For example, as described by Equation (8) above, the probability of an object failing at time t is generally expected to be proportional to its critical area, so that a test structure with a larger critical area would be expected to have a larger associated probability of failure at t. However, in order to accurately predict failures in an IC, it generally is desirable to separate the probability of an object being defected from the probability of failure at t given that it is defected. If $F_d(t)$ is used to estimate the latter probability, this may not be the case. If only a small fraction of the devices exhibit defect-related failure, it may be inaccurate and misleading to perform an analysis which assumes that the entire population is susceptible to defect-related failure.

In sum, because of the generally random nature and rarity of defect-related early failures, traditional approaches to reliability assurance, based on screening process outputs, have been recognized to be ineffective and costly. However, alternative approaches of building-in reliability by comprehending and controlling the factors that determine reliability at each stage during fabrication, and designing-in reliability by simulating defect-related failures for particular designs produced by particular processes may be limited by conventional reliability prediction methodologies and simulation tools which generally do not effectively predict defect-related early failures.

SUMMARY OF THE INVENTION

In light of the foregoing, it is an object of the present invention to provide systems, methods and computer program products for predicting integrated circuit reliability which more accurately predict process-induced, defect-related failures.

It is another object of the present invention to provide systems, methods and computer program products for integrated circuit reliability simulation which efficiently simulate complex integrated circuit layouts.

It is another object of the present invention to provide systems, methods and computer program products for predicting defect-related early integrated circuit failures which efficiently and accurately utilize sparse failure data.

These and other objects, features and advantages are provided according to the present invention by systems, methods and computer program products in which integrated circuit reliability is predicted by generating sample object lifetimes corresponding to sample object defects in objects in the circuit layout according to an accelerated life defect influence model which relates the magnitude of a defect in an object to an object lifetime, and predicting integrated circuit reliability based on the sample object lifetimes and the reliability connectivity of the corresponding objects in the integrated circuit design. Preferably, the accelerated life defect influence models are log-linear regression models which may include monotonic, deterministic functions of defect magnitude and non-monotonic distributions which relate a defect magnitude to a plurality of object lifetime values. Parameters of the models may be calibrated from a variety of predetermined reliability data for test objects, and models may be incorporated in computer program products to be utilized with a reliability simulator.

The present invention arises from the realization that accurate predictions of the lifetime of an integrated circuit can be obtained by representing the circuit as a collection of basic structural objects, e.g., metal runs, vias, and gate oxides, using Monte Carlo integration techniques to generate a plurality of sample defects induced by the integrated circuit fabrication process, applying models of object lifetime which relate the magnitude of these defects to object lifetime to generate sample object lifetimes, and combining the sample object lifetimes to predict integrated circuit reliability. Using this approach, the difficulties and errors associated with determining failure models and identifying subpopulations in reliability data can be reduced while making efficient use of usually sparse reliability data on early, defect-related extrinsic failures. Different models may be adopted for different types of objects, defects and associated failure mechanisms, allowing systems, methods and computer program products according to the present invention to be adapted based on the availability of models, the availability of reliability data concerning objects, the simulation accuracy desired, and the like.

In particular, according to the present invention, in systems, methods and computer program products for predicting defect-related failures in integrated circuits produced by an integrated circuit fabrication process, objects are identified in a circuit layout for the integrated circuit design, each object having a location in the circuit layout and a reliability connectivity in the integrated circuit design. Sample object defects are generated for the identified objects, each sample object defect representing a defect produced in an object by the integrated circuit fabrication process, each sample object defect having a defect magnitude associated therewith. An accelerated life defect influence model is identified for each sample object defect, each accelerated life defect influence model relating the lifetime of an object to the defect magnitude of a defect in the object. Sample object lifetimes are generated from the defect magnitudes associated with the sample object defects according to the corresponding identified accelerated life defect influence models. A prediction of the reliability of integrated circuits produced by the integrated circuit fabrication process according to the circuit layout is generated from the sample object lifetimes according to the reliability connectivity of the associated objects in the integrated circuit design. The prediction of the reliability of integrated circuits may include the generation of sample integrated circuit lifetimes from the sample object lifetimes according to the reliability connectivity of the associated objects.

Preferably, the identification of accelerated life defect influence models includes the identification of a log-linear regression model for at least one of the sample object defects, the log-linear regression model having the form $$\ln T = \mu_O - \beta^T \zeta + \epsilon,$$

wherein T represents an object lifetime, wherein $\mu_O$ represents a parameter corresponding to an expected value of an object lifetime, wherein $\beta$ represents a distribution parameter, wherein $\zeta$ represents a defect influence, and wherein $\epsilon$ represents an unobservable random variable uncorrelated with $\zeta$. The step of generating sample object lifetimes may thus include generating a sample object lifetime corresponding to the at least one sample object defect from the defect magnitude of the at least one sample object defect according to the corresponding log-linear regression model. The identified log-linear regression model may include a deterministic object lifetime function relating the defect magnitude of the at least one sample object defect to one object lifetime value, and the sample object lifetime corresponding to the at least one sample object defect may be generated by computing a sample object lifetime corresponding to the at least one sample object defect from the defect magnitude of the at least one sample object defect according to the deterministic object lifetime function. The log-linear regression model may also include a log-linear object lifetime distribution relating the defect magnitude of a sample object defect to a plurality of object lifetime values, and the sample object lifetime corresponding to the at least one sample object defect may be generated by sampling the log-linear object lifetime distribution.

The log-linear regression model may be a predetermined generalized parametric object lifetime distribution function derived from intrinsic reliability data and having a distribution parameter related to the defect magnitude of a sample object defect by a distribution parameter function. To generate a sample object lifetime corresponding to the at least one sample object defect, a value may be computed for the distribution parameter for the at least one sample object defect from the defect magnitude of the at least one sample object defect according to the distribution parameter function to thereby define a particularized object lifetime distribution function for the at least one sample object defect, and the particularized object lifetime distribution function may then be sampled to generate a sample object lifetime corresponding to the at least one sample object defect.

The log-linear regression model may be a predetermined generalized parametric object lifetime distribution function derived from intrinsic reliability data and having a distribution parameter related to the defect magnitude of a sample object defect and a conditional probability factor by a distribution parameter function, the conditional probability factor being independent of the generalized object lifetime distribution. To generate a sample object lifetime corresponding to the at least one sample object defect, a value may be computed for the distribution parameter for the at least one sample object defect from the defect magnitude of the at least one sample object defect and the conditional probability factor according to the distribution parameter function to thereby define a particularized object lifetime distribution function for the at least one sample object defect, and the particularized object lifetime distribution function sampled to thereby generate a sample object lifetime corresponding to the at least one sample object defect.

Different defect influence models may be applied to generate sample object lifetimes for different types of objects in the circuit layout. A deterministic object lifetime function relating the defect magnitude defect of a first sample object defect to one object lifetime value may be identified for the first sample object defect, and an object lifetime distribution relating the defect magnitude of a second sample object to a plurality of object lifetime values may be identified for the second object defect. An object lifetime value may be computed from the defect magnitude of the first sample object defect according to the deterministic object lifetime function to thereby generate a sample object lifetime corresponding to the first sample object defect, and the object lifetime distribution related to the defect magnitude of the second sample object defect may be sampled to thereby generate a sample object lifetime corresponding to the second sample object defect.

According to a preferred sampling aspect for producing sample object defects, a process flaw distribution associated with the integrated circuit fabrication process is provided, the process flaw distribution representing a statistical distribution of flaws produced by the integrated circuit fabrication process. Sample flaws are generated according to the process flaw distribution, each of the sample flaws having a location with respect to the circuit layout. The locations of the sample flaws are correlated with the locations of the identified objects to thereby generate sample object defects, each sample object defect representing a defect induced in an object by a sample flaw, each sample object defect having a defect magnitude associated therewith. The process flaw distribution may include at least one of a process flaw magnitude distribution, a process flaw spatial distribution, and a process flaw quantity distribution. Preferably, the process flaw distribution includes a process flaw magnitude distribution, a process flaw spatial distribution, and a process flaw quantity distribution.

The sample flaws preferably are generated by sampling the process flaw distribution, more preferably using Monte Carlo techniques. The objects identified in the circuit layout may have a critical area associated therewith and the sample flaws generated may have a location and an area, and the correlation of the locations of sample flaws with the locations of the identified objects may include generating a sample object defect if a critical area of an object intersects the area of a sample flaw. Thus, a critical area concept may be used to identify which objects are defected by sample process flaws.

According to a preferred cellular aspect, cells are identified in the circuit layout, each of the cells occupying an area of the circuit layout and having a reliability connectivity in the integrated circuit design. Objects are identified within each cell, each of the objects within a cell having a location in the cell and a reliability connectivity in the cell. Sample object defects are generated for objects within the cells, and sample object lifetimes are generated for sample object defects within the cells. A prediction of the reliability of integrated circuits is generated by generating sample cell lifetimes for cells from the sample object lifetimes for objects within the cells according to the reliability connectivity of the associated objects in the cells, and generating a prediction of the reliability of integrated circuits produced by the integrated circuit fabrication process from the sample cell lifetimes according to the reliability connectivity of the associated cells in the integrated circuit design.

To utilize the generated reliability prediction, the integrated circuit design may be modified based on the predicted reliability of integrated circuits produced by the integrated circuit process according to the circuit layout. The integrated circuit fabrication process may also be similarly modified. Systems and methods for designing-in reliability in integrated circuits are thereby provided.

According to a first calibration method aspect, a parameter of an accelerated life defect influence model for an integrated circuit reliability simulation may be calibrated from a predetermined object defect magnitude distribution for an object produced by the integrated circuit fabrication process and predetermined reliability data for instances of the object produced by the integrated circuit fabrication process. An initial value is provided for the parameter. Sample object defects are generated for the object from the predetermined object defect magnitude distribution, each sample object defect having a defect magnitude associated therewith. Simulated reliability data are generated for instances of the object produced by the integrated circuit fabrication process from the defect magnitudes associated with the sample object defects according to the accelerated life defect influence model. The value of the parameter of the accelerated life defect influence model is modified if the simulated reliability data differs from the predetermined reliability data by an amount greater than a predetermined tolerance. The steps of generating sample object defects, generating simulated reliability data, and modifying the value of the parameter of the accelerated life defect influence model are repeated until the simulated reliability data differs from the predetermined reliability data by an amount less than the predetermined tolerance.

Different types of predetermined reliability data may be used to perform calibration. The predetermined reliability data may include predetermined extrinsic reliability data representing defect-related failures of instances of the object, and the generated simulated reliability data may include simulated extrinsic reliability data. The predetermined reliability data may be predetermined intrinsic reliability data for instances of the object and predetermined reliability data for instances of an integrated circuit including the object, the predetermined intrinsic reliability data for the object representing wearout-related failures of instances of the object, the predetermined reliability data for the integrated circuit representing defect-related and wearout-related failures circuit. In such he integrated circuit. In such a case, before generating simulated reliability data, extrinsic reliability data representing failures of defected instances of the object is derived from the predetermined intrinsic reliability data. The subsequently generated simulated reliability data includes simulated extrinsic reliability data for the integrated circuit. The predetermined reliability data may also be predetermined reliability data for instances of an integrated circuit including the object, representing defect-related and wearout-related failures of instances of the integrated circuit. The subsequently generated simulated reliability data includes simulated extrinsic reliability data for instances of the integrated circuit produced by the integrated circuit fabrication process from the accelerated life defect influence model, the defect magnitudes associated with the sample object defects, and the predetermined reliability data for the integrated circuit.

According to a second calibration method aspect, a parameter of a defect magnitude distribution for an integrated circuit reliability simulator is calibrated from a predetermined accelerated life defect influence model for an object and predetermined reliability data for instances of the object produced by the integrated circuit fabrication process, the defect magnitude distribution relating the magnitude of a defect produced in the object by the integrated circuit fabrication process to predetermined reliability data for instances of an object produced by the integrated circuit fabrication process. An initial value is provided for the parameter. Sample object defects are generated for the object from the defect magnitude distribution, each sample object defect having a defect magnitude associated therewith. Simulated reliability data is generated for instances of the object produced by the integrated circuit fabrication process from the defect magnitudes associated with the sample object defects according to the accelerated life defect influence model. The value of the parameter of the defect magnitude distribution is modified if the simulated reliability data differs from the predetermined reliability data by an amount greater than a predetermined tolerance. The steps of generating sample object defects, generating simulated reliability data and modifying the value of the parameter of the defect magnitude distribution are repeated until the simulated reliability data differs from the predetermined reliability data by an amount less than the predetermined tolerance. As with the first calibration aspect, different types of predetermined reliability data may be utilized.

According to another aspect of the present invention, a computer program product is provided for use with a computer-based reliability simulator to produce a sample object lifetime for an object in a circuit layout of an integrated circuit design for a sample object defect in the object according to an accelerated life defect influence model for the sample object defect. A computer-readable storage medium having computer-readable program code means embodied therein includes computer-readable program code means for generating a sample object lifetime from the stored defect magnitude according to the accelerated life defect influence model. Preferably, the accelerated life defect influence model is a log-linear regression model of one of the types described herein and the computer-readable computer program code means includes second computer-readable program code means for generating a sample object lifetime corresponding to the sample object defect from the defect magnitude of the sample object defect according to the log-linear regression model. A modular computer program product incorporating a defect influence model for object lifetime is thereby provided which may be implemented, for example, as a modular subroutine, program object, and the like, for use with a reliability simulation program or similar reliability simulation tool.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION

Figure 1:
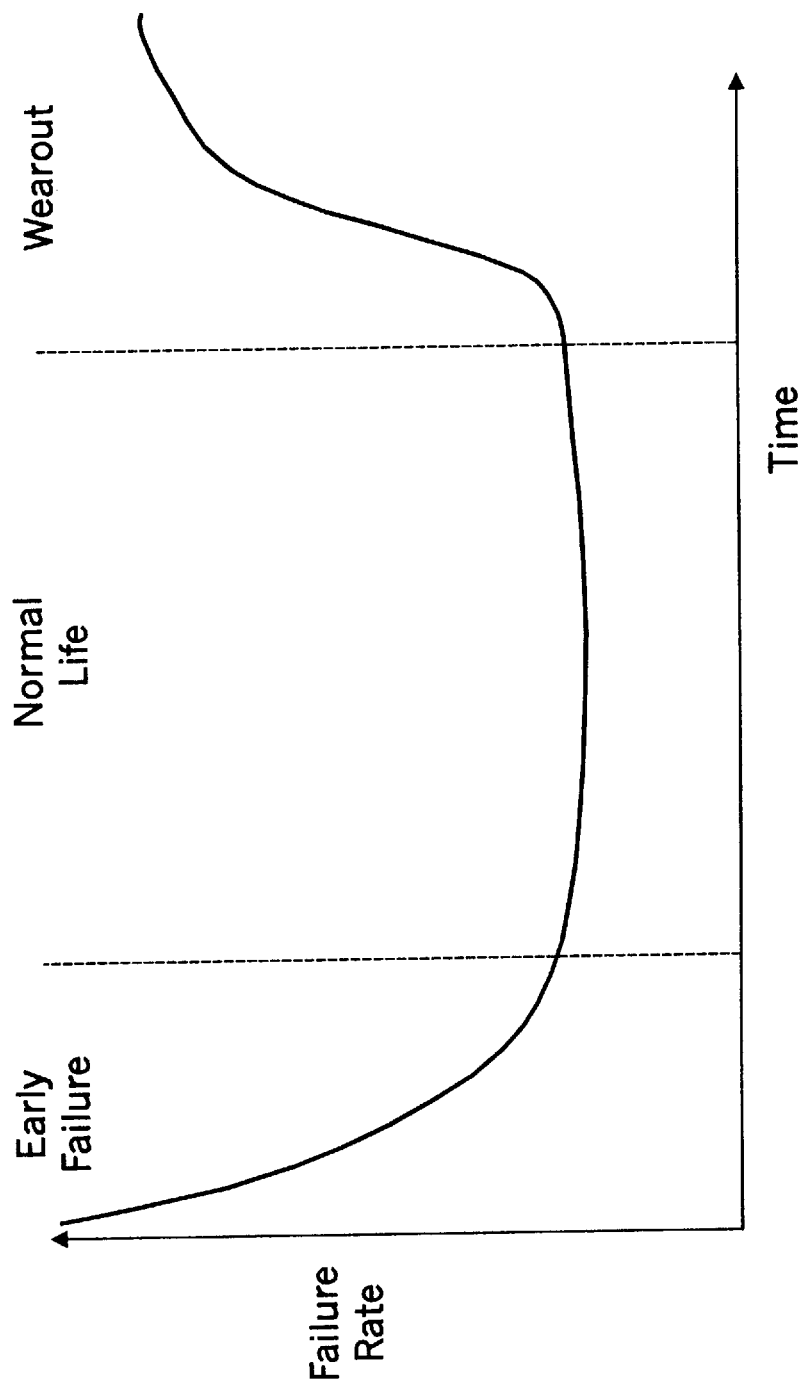
FIG. 1 illustrates a typical lifetime distribution for integrated circuits.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

I. Overview: Modeling Integrated Circuit Failures Based on Defect Influence

Those skilled in the art will understand that as used herein, "object" refers to a structure within an integrated circuit and can include an entire integrated circuit itself. Those skilled in the art will also appreciate that when defining or interpreting cumulative distribution functions (Cdfs), the reliability of an object may be defined as the probability that the object will perform its required function under stated conditions for a stated period of time. As such, "time" as referred to hereinafter, refers to "operational time", the period that the object is subject to some set of given conditions, which may not necessarily correspond to clock time. "Lifetime" will be used to denote the useful life of an object under a set of given conditions, before failure according to a specified failure mechanism.

A. Defect Classifications and Flaw Distributions

Those skilled in the art will understand that the fabrication of integrated circuit objects may be traced through a complex sequence of interdependent processing steps, and that defects generated at each step may not be independent of each other. Furthermore, the specific manufacturing equipment used for each step, and the type of processing involved, may contribute to a potentially unique set of defect characteristics for each fabrication line, even if the same recipe and the same equipment type is used.

However, for reliability assessment purposes, the exact origin of defects need not be resolved. Assuming that a fabrication process has been commissioned and is "in-control," it may be sufficient to characterize the effects of a complete set of processing steps in terms of the eventual distribution of defects measured in the objects produced. If a new process is under development, target in-control distributions may be assumed until further data is obtained.

As previously discussed, defects may be considered as manufacturing flaws that precipitate early failure. For purposes of simulation, some way to distinguish between defect-inducing and non-defect-inducing flaws is thus desirable. Since Monte Carlo simulation is preferably used according to the present invention to determine which objects are flawed, the present invention adopts an approach wherein a user-defined model locally translates flaws to defects. The translation includes a decision as to whether the flaw should be considered a defect, and the effect of the resulting defect on object lifetime.

Flaws may be categorized as being either microscopic or macroscopic. Microscopic flaws may be defined as flaws having atomic dimensions, e.g., vacancies, interstitials, impurity atoms present substitutionally or interstitially, and the like. Macroscopic flaws may be defined as flaws having magnitude comparable to object feature sizes, e.g., line width, layer thickness, and the like. According to the present invention, it may be assumed that such flaws are measurable, either directly or by inference from their effect on other measurable object parameters, and that a physically justified correlation between such measurable flaws and object reliability may be established.

In current manufacturing practice, wafers that will eventually pass through the same sequence of fabrication steps typically are first batched together according to equipment capacity constraints, these batches conventionally being referred to as "lots." Depending on the kind of processing required, the wafers within a lot may be processed concurrently or processed sequentially without interruption by the same equipment, such that wafers within a lot generally experience the same nominal environment. However, the occurrence of flaws has been found to be both temporally and spatially dependent, i.e., the spatial location of a wafer within a piece of equipment and the temporal history of processing within the equipment may be significant. Thus, for the purpose of the reliability models used according to the present invention, the distribution of flaw magnitudes, their spatial distribution across wafers and within chips, and their distribution in quantity from lot-to-lot and from wafer-to-wafer within a lot for all objects of interest may be specified. Although those skilled in the art will understand that industry is moving towards single-wafer and cluster processing techniques for which lot-to-lot distributions may cease to be an issue, it will be understood that the present invention encompasses single-wafer and lot-oriented processing.

To model the distribution of the number of flaws that occur on a wafer, two distributions preferably are used, a first for generating the number of flaws within a lot, and a second for generating the ensuing number on a wafer. Let $\lambda_1$ be a discrete random variable representing the number of flaws that occur within a lot l, with its probability mass distributed as:

$$\lambda_1 \sim f_\lambda(\theta_\lambda), \qquad (10)$$

where $f_\lambda(\theta_\lambda)$ is some user-specified function, for example, the Poisson or the negative-binomial distribution. The number of flaws that occur on a wafer w within the lot l may be denoted by $\omega$, with its probability mass distributed as:

$$\omega_w \sim f_w(\lambda_1, \theta_w) \qquad (11)$$

where $f_w(\lambda_1, \theta_w)$ is some user-specified function. The number that eventually occur within a die may be denoted by $\iota$. This number may be dependent on the spatial distribution described below.

A generally applicable statistical characterization of the flaw spatial distribution may be difficult to obtain, with the difficulty lying in determining sufficient statistics and in selecting distribution forms that adequately fit measured data. Those skilled in the art will understand that "quadrat analysis" of wafers, coupled with fitting by a negative binomial distribution, may provide a reasonably accurate approach for technologies with minimum feature size less than approximately 0.3 $\mu$m. A distinguishing feature of quadrat analysis is that the quadrats may be defined independently of chip dimensions, which may avoid the problems introduced when chip dimensions are used to define quadrats, especially when defect clustering occurs. Thus, "small-area," "medium-area" and "large-area" clustering effects may be accommodated.

Figure 2:
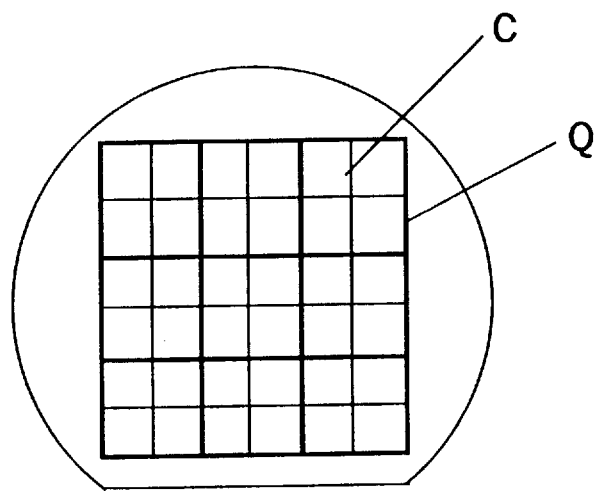
FIGS. 2 and 3 illustrate distribution of quadrats on a wafer for determining distribution of process flaws.
Figure 3:
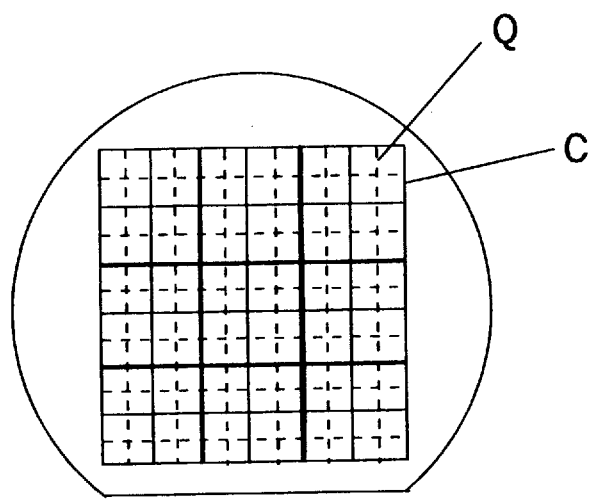

The demarcation of quadrats on wafers and their relationship to chips of varying dimensions are illustrated in FIG. 2, which illustrates quadrats Q having area greater than the area of chips C, and FIG. 3, which illustrates quadrats Q having area less than the areas of chips C. As used herein, a quadrat includes the smallest disjoint unit of area that the wafer can be divided into, such that these areas are statistically independent with respect to manufacturing flaws. Let $\kappa_q$ denote the number of flaws that occur within a quadrat q on a wafer w, with its probability mass distributed as:

$$\kappa_q = f_\kappa(\omega_w, \theta_\kappa), \quad (12)$$

where $f_\kappa(\omega_w, \theta_\kappa)$ is some user-specified function, for example, a negative binomial. Within quadrats, defect placement may follow a two-dimensional uniform distribution. The distribution used to arrive at the set of flaws within a quadrat, the quadrat dimensions, and the mapping of chips and quadrats to the wafer surface may all be user-definable according to the present invention, making the present invention applicable to other models.

Figure 4:
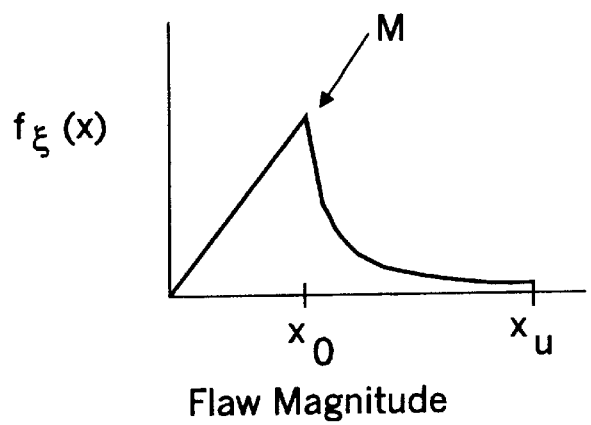
FIG. 4 illustrates an exemplary distribution of process flaw magnitudes.

The flaw magnitude distribution pertaining to a particular failure mechanism may be obtained from process monitors on processed wafers directly, for example, by using automated visual scanners, or indirectly, for example, by inference from a set of electrical measurements. An exemplary distribution for directly measured flaws is depicted in FIG. 4, where a single mode M at a critical magnitude $x_o$ related to measurement resolution may be seen, with the distribution falling off as some power-law of flaw-magnitude on either side, starting with a magnitude of zero and being truncated at a maximum $x_u$. For indirectly inferred flaws, i.e. flaws inferred from the magnitude of the defects ascribed to them, a continuous distribution with a similar form may be used to fit the data, or a discrete distribution, e.g. a multinomial, may be employed.

Let $\xi_m$ denote the magnitude of a flaw correlated with failure mechanism m, and let $f_\epsilon(\chi)$ be its probability density or probability mass function. For $f_\epsilon(\chi)$, a density function may be used having the form:

$$f_\epsilon(x) = \begin{cases} c_q x^q & 0 \leq x \leq x_0 \\ c_p/x^p & x_0 < x \leq x_u \end{cases}, \quad (13)$$

where $$c_n = (p-1) + (q+1)\left[1 - \left(\frac{x_o}{x_u}\right)^{p-1}\right], \quad (14)$$

$$c_q = (p-1)(q+1)c_n/x_o^{q+1}, \text{ and} \quad (15)$$

$$c_p = (p-1)(q+1)x_o^{p-1}/c_n. \quad (16)$$

This distribution allows flexibility in assigning proportions to the number of flaws on either side of the mode $x_o$, through the parameters p and q. "Yield neutral" values p=3 and q=1 may be used, resulting in an approximately equal proportion of flaws smaller than $x_o$ and flaws larger than $x_o$. Other suitable distribution forms, e.g. Rayleigh and gamma, may also be employed.

B. Object Critical Area

Figure 5:
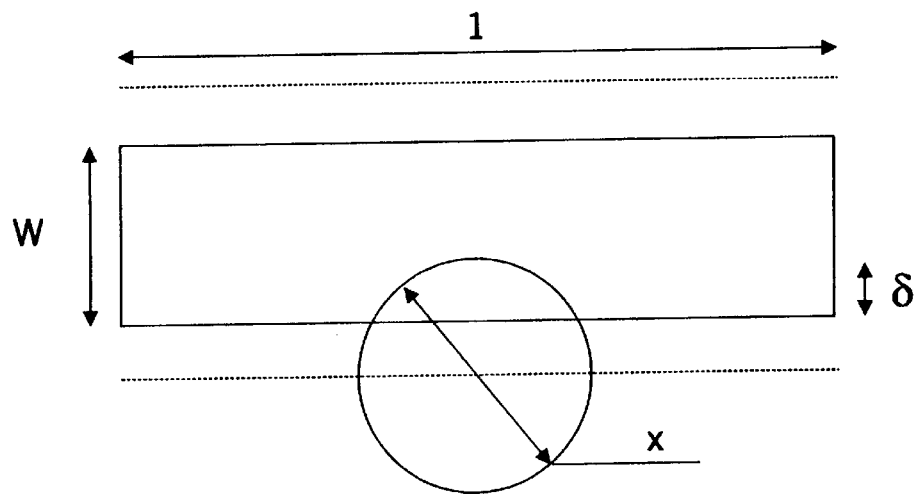
FIG. 5 illustrates an exemplary object from an integrated circuit layout having a critical area.

In order to quantify the magnitude of defects that results in objects from flaw distributions, the concept of "critical area" may be useful. The critical area of an object includes the region, e.g., a point, a contour, an area, a volume and the like, within which, if a flaw occurs, it will cause the object to be defected. It may be a function of the magnitude, geometry and nature of the flaw, the geometry and layout of affected objects, and the location of the flaw with respect to the affected objects. FIG. 5 illustrates the concept for a case of a particulate-induced subtractive defect in a metal stripe. Here the critical area $A(x,\delta)$ includes the region within which, if the center of a particulate of diameter x falls, a width reduction (defect) of magnitude greater than or equal to $\delta$ results. Thus, $$A(x,\delta) = 1(w+x-2\delta) \text{ for } 0 \leq \delta \leq x. \quad (17)$$

The particulate is assumed to be circular to simplify the modeling; those skilled in the art will understand that other shapes may also be used.

Conceptually, critical area is an abstraction which may be useful for an analytical model, modified in the following manner. A function $Ko_m(x,\delta)$ may be defined to indicate whether a defect of magnitude $\delta$ results in object o, given that a flaw of magnitude x has occurred, i.e., $$K_{o_m}(x,\delta) = \begin{cases} 1 & \text{if } o \text{ has defect magnitude } \delta \\ 0 & \text{otherwise} \end{cases} \quad (18)$$

In FIG. 5, the critical area for the stripe with respect to particulates of diameter x to cause defects of magnitude $\delta$ includes the set of dotted lines. If the coordinates of the center of a particulate of diameter x coincide with that of any point on these lines, then $Ko_m(x,\delta)$ will have the value 1 for that particulate, otherwise it will have the value 0.

If $f_o(\delta)$ represents a distribution of defects that occurs in object o as a result of an integrated circuit fabrication process, $f_o(\delta)$ may be sampled during Monte Carlo integration by generating random variates distributed according to the flaw quantity, spatial and magnitude distributions, and subsequently invoking $Ko_m(x,\delta)$. In this manner, a distribution of flaws that occur during manufacture may be translated to a distribution of defects having defect magnitude $\delta$ that may be presumed to cause early failure in objects.

C. Defect Influence in Reliability Modeling

As stated above, infant mortality in objects, e.g. ICs may be attributed to manufacturing flaws, i.e., defects that precipitate early failure. The present invention arises from the realization that practical simulation systems and methods may be developed by obtaining a sufficient statistical characterization of the impact of defects on reliability such that the statistics generated by the simulation retain enough of the defect's physical characteristics to provide feedback that may be interpreted on a physical basis. To surmount the difficulties with prior Cdf-based models, the present invention uses a concept of "defect influence" as a basis for simulation. According to the concept of defect influence as applied with the present invention, objects of the same type, subject to the same stress conditions and having an identical associated defect influence may be assumed to have lifetimes that follow identical probability laws, independent of their critical areas.

Defect influence arises from models relating the effect of explanatory variables or covariates on lifetime. Let $\zeta_o$ be a q×1 vector representing covariates that affect the lifetime of an object o. The components of $\zeta_o$ may themselves be synthesized as functions, e.g., integrals, derivatives, sums, differences, products and the like, of the covariates as recorded, similar to well-known methods used in multiple regression analysis. The components may also be time-dependent. In particular, defect influence $\zeta$ preferably includes $\delta$, the measure of defect magnitude described above.

$\psi(\zeta_o;\beta_o)$ denotes a function that links $\zeta$ to the failure of o, wherein $\beta_o$ is a q×1 parameter vector characterizing $\psi$. According to the present invention, it may be assumed that the lifetime distribution of o may be specified in two parts: (1) a model for when $\zeta=0$ and (2) a representation of the change induced by a nonzero $\zeta$. For purposes of the following discussion, $\zeta=0$ corresponds to a non-defected state, and increasing $\psi$ corresponds to an increasing risk of failure, or decreasing lifetime. Those skilled in the art will understand that other conventions may be used with the present invention.

According to a preferred "accelerated life" model with covariates that are not time-dependent, for failures due to a single mechanism, if $T_0$ is a random variable representing the lifetime of an object for $\zeta=0$ and $\psi(0)=1$, then $$T = T_0/\psi(\zeta). \tag{19}$$

If $\mu_0 = E\{\ln T_0\}$, i.e., the expected value of the object lifetime T0, then this may be written as:

$$\ln T = \mu_0 - \ln \psi(\zeta) + \epsilon, \tag{20}$$

where $\epsilon$ is a random variable of zero mean and with a distribution not depending on $\zeta$. If $\psi(\zeta,\beta)$ is chosen such that:

$$\psi(\zeta;\beta) = e^{\beta^T \zeta}, \tag{21}$$

where $\beta^T$ is the transpose of $\beta$, then $$\ln T = \mu_0 - \beta^T \zeta + \epsilon, \tag{22}$$

which represents a log-linear regression model. Equation (22) can be used to describe a wide variety of so-called "location and shape" lifetime distributions, including exponential, Weibull, and lognormal distributions, among others. Those skilled in the art will understand that is also possible to interpret Equation (22) in terms of failure models other than an accelerated life model, including, for example, a "proportional hazards" model.

The log-linear regression model of Equation (22) may be interpreted such that T represents an accurately observable random variable, $\zeta$ represents accurately observable random variables, and $\epsilon$ represents uncorrelated unobservable random variables, with the variability of T being given by the joint variability of $\zeta$ and $\epsilon$. If it is possible to separate the variability in T that is ascribed to $\epsilon$ from that ascribed to $\zeta$, then $\zeta$ can be related to the extrinsic quality and reliability of the objects modeled. In other words, the extrinsic variability of T may be determined by $\zeta$.

This interpretation may be illustrated by a deterministic model of gate oxide failure, in which $\mu_0 = \ln \tau_c$, $\beta = G$, $\zeta = (x_{ox,nom} - \delta)/V_{ox}$ and $\epsilon = 0$. Here, $x_{ox,nom}$ refers to the nominal oxide thickness, and $\delta$ represents a flaw-induced effective thinning. For a given set of test conditions, all of these factors except for $\delta$ are constants, so that the distribution of $\delta$ results in the distribution of $\ln T$.

Thus, defect influence $\zeta$ can be translated to a defect-related lifetime $T(\zeta)$ and an extrinsic distribution through Monte Carlo integration. If $p_{o\zeta}$ represents the probability of occurrence of a defect influence of $\zeta$ in object o, an extrinsic distribution of o may be constructed by a series of $p_{o\zeta}$ and $T_o(\zeta)$ pairs, where $p_{o\zeta}$ is determined by integrating over the flaw distributions as described above. The effect of mutually independent failure mechanisms, m, can be incorporated by $$T_o^k = \min_m T_{om}(\zeta_{om}^k), \tag{23}$$

where k refers to the $k^{th}$ sample of object o in the integration. The desire to focus on defect-related failures thus may be accommodated according to the present invention by excluding the lifetimes of non-defected objects from consideration during simulation. Numerical accuracy may also be enhanced by sampling exclusively in the region of interest.

D. Quantifying Defectivity

For practical purposes of predicting and improving the reliability of ICs produced by a given set of processes, defect generation, for each type of object to be included in the simulation, desirably is based on physically measurable covariates that are known to have a strong and physically justifiable correlation with extrinsic failures. Alternatively, an inductive statistical relationship between some measurable covariate and extrinsic failures, e.g., a correlation of particulate levels with yield and reliability, may be useful.

The magnitude of a defect may be defined to be a measurable quantity that produces a measurable effect on the lifetime of a correspondingly defected object. For example, defect magnitude may include the amount of reduction in the width of a metal stripe, the amount of reduction in the barrier height in a gate oxide due to chemical contamination, the number of traps generated in a gate oxide by a process, and the like. Those skilled in the art will understand that this definition does not require a monotonic relationship between defect magnitude and object lifetime to exist.

Using $\delta_o$ to denoting the magnitude of a defect in object o, and $T_o(\zeta)$ to denote the associated lifetime of a non-defective object o, two approaches to applying the defect influence model of Equation (22) to measured data may be taken. According to a deterministic approach, it is assumed that $\epsilon \approx 0$ such that:

$$\ln T_o(\zeta) = \mu_0 - \beta^T \zeta. \tag{24}$$

Thus, according to a deterministic defect influence modeling aspect of the invention, the lifetime of an object may be related to defect influence $\zeta$ according to a monotonic function, i.e., object lifetime may be related to defect magnitude $\delta$ according to a deterministic object lifetime function which relates one defect magnitude value to one object lifetime value.

For a gate oxide model, for example, such a relationship may be derived by assuming a direct proportionality between charge-to-breakdown (Qbd) and lifetime. Specifically, lifetime may be determined by:

$$\ln T = \ln \tau_c + G \frac{X_{ox,eff}}{V_{ox}}, \tag{25}$$

where $X_{ox,eff}$ is the effective oxide thickness, $V_{ox}$ is the voltage across the oxide, G is a field acceleration factor, and $\tau_c$ is a constant.

G and $\tau_c$ are typically material dependent, and $$X_{ox,eff} = X_{ox,nom} - \delta, \tag{26}$$

where $X_{ox,nom}$ is the nominal oxide thickness and defect magnitude $\delta$ represents the amount of "effective thinning". Those skilled in the art will understand that Equation (25) is useful for reliability prediction in that the exact origin of the defect magnitude $\delta$ need not be identified; defect magnitude $\delta$ may serve as a convenient and consistent measure in a model that relates Qbd to the applied electric field.

Another example is provided by a deterministic model applicable to metal runs. For metal runs, a relationship may be developed between lifetime and the existence of a characteristic polygranular segment length over which a sufficiently large divergence in electromigration-induced mass transport occurs. In particular, $$\ln T_o = \ln \tau_0 - \frac{x_{eff}}{x_0}, \tag{27}$$

where $x_{eff}$ is the length of the largest polygranular segment, $x_0$ is a characteristic segment length, and $\tau_0$ is a constant. The characteristic segment length may be defined as:

$$x_0 = \frac{kT}{ez^* \rho j}, \tag{28}$$

where $ez^*$ is the effective charge, $\rho$ is the resistivity, j is the current density, T is the temperature, and k is Boltzmann's constant. It is possible to set $$\delta = x_{\mathit{eff}},\qquad(29)$$

thus defining a deterministic object lifetime function.

In contrast to deterministic models, nondeterministic models may retain the full form of Equation (22) such that a given defect magnitude may translate to an object lifetime distribution relating a defect magnitude to a plurality of object lifetime values. Non-deterministic models for use with the present invention may include at least three types of models. According to one model, a parametric Cdf may be fitted to measured data, and the distribution parameters recast as a deterministic distribution parameter function relating the distribution parameters to defect magnitude. For example, an "effective thinning" at the defect site could result in increased current density in a metal run with a subtractive defect, resulting in a reduced median time to failure ($t_{50}$), where defect magnitude $\delta$ may correspond to linewidth reduction and $t_{50}$ may be related to current density. Those skilled in the art will recognize that this type of model may be well-suited to situations where current density is the dominant factor in determining failure.

Another approach, one that is part-empirical part-probabilistic, includes empirically relating extrinsic distribution parameters to intrinsic distribution parameters, with the additional constraint that the probability of extrinsic failure may be conditioned on separately determined factors. For example, for metal runs, the morphology of a metal stripe at a defect site (bamboo or polycrystalline, for example), together with the magnitude of the linewidth reduction, i.e., the defect magnitude $\delta$, may be used to determine the probability that an extrinsic failure will occur, with the assumption that all extrinsic failures follow the same distribution regardless of defect magnitude.

A purely statistical approach may also be adopted, wherein instead of determining a relationship between defect magnitude and extrinsic Cdf, a distribution is fitted to measured extrinsic data, effectively averaging over the actual defect magnitudes, and extrapolations based on the properties of the distribution form are made. For example, an average defect density may be measured on thin oxide capacitors of given area and the closure property of the Weibull distribution used to extrapolate the results for different area capacitors.

E. Graph Theoretical Simulation Procedures for Integrated Circuit Failure Prediction O may be defined as the set of all objects used to construct the integrated circuit, and it may be assumed that an object $o \in O$ can be in only one of two states, either functioning or failed, after a period t of operation under specified conditions. As described above, $T_o$ may be used to denote the lifetime of o. Let $G=(V,E)$ represent the reliability graph of the integrated circuit, with vertex set V and edge set E, with every vertex $v \in V$ assumed to be perfectly reliable. For every $O \in O$ there is at least one edge $e \in E$, and it has associated with it the lifetime $T_e = T_o$. All edge failures may be assumed to be mutually independent.

A series-parallel graph may be defined as follows. In a graph, edges with the same end vertices may be considered parallel edges. Two non-parallel edges may be considered adjacent if they are incident to a common vertex. Two adjacent edges may be considered series edges if their common vertex is at degree 2. Replacing a pair of series (parallel) edges by a single edge is a so-called "parallel" replacement. A series-parallel graph is a graph that can be reduced to a single edge by successive series and parallel replacements. A subgraph of G is the graph $G'=(V',E')$, if $V' \subseteq V$ and $E' \subseteq E$. G' may be called a series subgraph if it can be reduced to a single edge by a succession of exclusively series replacements.

If G is constrained to be a coherent series-parallel graph, with coherency meaning that failure of an edge cannot result in the subgraph that contains it becoming functional again, and if two vertices u and v are considered connected if there exists a sequence of vertices and edges of the form u, (u,$v_i$), vi, . . . $v_j$, v), v, a sequence referred to as a "path," an integrated circuit may be considered to be functional after a period t of operation under specified conditions if a path containing solely functioning edges between two distinguished vertices $S \in V$ and $T \in V$ exists. Prediction of the lifetime of an integrated circuit may thus be considered to include the determination of the probability that a path consisting of functioning edges between S and T does not exist after a period t of operation under specified conditions. If $T_G$ is the lifetime of the IC, this probability may be denoted by $F_G(t)$, where $$F_G(t)=Pr\{T_G \leq t\}.\qquad(30)$$

If a series subgraph S fails if at least one edge $e \in S$ fails, Ts may be represented by:

$$T_S = {}^{min}_{e \in S} T_e.\qquad(31)$$

If a parallel subgraph P fails if all edges $e \in S$ fails, Tp may be represented by:

$$T_P = {}^{max}_{e \in P} T_e.\qquad(32)$$

Those skilled in the art will appreciate that formulation of reliability predictions according to the present invention corresponds to the way in which many integrated circuits are designed. Those sub-circuits that are essential for system operation will contribute subgraphs that will be placed in series on the path from S to T, while redundant sub-circuits will contribute subgraphs that will be placed in parallel with each other. The subgraphs corresponding to sub-circuits may themselves be constructed by series-parallel decompositions until the object level is reached, e.g., sub-circuits may recursively include sub-circuits. Thus, a link between object failure and IC failure may be established.

Integrated circuits often are series systems, which may simplify reliability predictions according to the present invention. Specifically, the ability to analyze failures due to each subsystem separately, and then to combine them in a computationally efficient manner, may be advantageous in itself and, if systems containing redundancy are analyzed as series systems, a useful worst-case lower bound on reliability for these systems can be estimated quickly and economically.

Let $x_o(t)$ represent a binary variable indicating the state of an object o at time t, i.e., $$x_o(t) = \begin{cases} 1 & \text{if } T_0 > t \\ o & \text{if } T_0 \leq t \end{cases},\qquad(33)$$

and let $x(t)=[x_{o1}(t), \ldots, x_{no}(t)]$ represent a corresponding object state vector, where $n_o=|0|$, i.e., the cardinality of the set of objects O. In addition, define a system structure function $\phi_G(x(t))$ such that $$\phi_G(x(t)) = \begin{cases} 1 & \text{if } S \text{ and } T \text{ are connected} \\ 0 & \text{otherwise} \end{cases}.\qquad(34)$$

The effects of the processing environment, material properties, object structure and use-conditions may be captured by x(t), while the effect of circuit architecture may be captured by $\phi_G$. If G is used to represent general k-out-of-n systems, the problem of determining connectivity between S and T generally will be exponentially dependent on the size of G, while if it is restricted to simple series-parallel systems, the problem may be soluble in linear time.

An example is provided by a situation where a simulator mimics the result of placing a sample of N chips on lifetest under specified stressing conditions, assuming that only a single failure mechanism, m, is being considered. For each chip k, $\iota^k$ random variates $\{\xi_j^k; j=1, \ldots, \iota^k\}$, representing flaws of magnitude $\xi$, may be generated and located according to their specific flaw distribution as described above. Then the lifetime of each object o in chip k may be determined as:

$$T_o^k = \begin{cases} \min_j T_o(\zeta) & \forall j: K_o(\xi_j^k, \delta) = 1 \\ \infty & \text{otherwise} \end{cases} \quad (35)$$

If $K_o(\xi_j^k,\delta)=1$ for more than one $\xi_j^k$, then that $\xi_j^k$ which results in the shortest lifetime may be selected; the others may be discarded resulting in an effective sampling of objects without replacement, for each chip. An estimate of $F_{Gm}(t)$ may then be constructed by:

$$\hat{F}_{G_m}(t) = 1 - \frac{1}{N} \sum_{k=1}^{N} \phi G(x^k(t)). \quad (36)$$

Multiple mutually independent failure mechanisms can be handled as follows. For each chip k, $\iota_m^k$ random flaws $\{\xi_j^k; j=1, \ldots, \iota_m^k\}$ may be generated per mechanism m. These flaws may then be used to determine $T_o^k$ by combining Equations (23) and (35) as follows:

$$T_o^k = \begin{cases} \min_m \min_j T_{om}(\zeta_j) & \forall j: K_{om}(\zeta_{mj}^k, \delta) = 1 \\ \infty & \text{otherwise} \end{cases} \quad (37)$$

Again, sampling of objects may be done without replacement, and $F_G(t)$ may be estimated as in Equation (36).

II. Implementation

A. An Early, Defect-Related Simulation Framework

A preferred embodiment of the invention may be implemented in a computer program which runs on a data processing system such as a standard integrated circuit design workstation running a design software package such as MentorGraphics® V8 ICStation®. As such a data processing system is well known to those skilled in the art, it need only be briefly described. Those skilled in the art will appreciate that other data processing systems may be used with the present invention, such as mainframe computers, minicomputers, personal computers, and the like.

Similarly, the invention utilizes, in part, statistical techniques for sampling data, such as Monte Carlo integration. Those skilled in the art will understand that Monte Carlo integration generally involves sampling from predetermined distributions, ideally in a random fashion. Those skilled in the art will understand that as a practical matter, near-ideal random sampling of a distribution may be achieved in a data processing environment by the use of random number generators to sample the distributions. These techniques are well-known and need not be described in further detail herein. Rather, the description will concentrate on systems, methods, and computer program products for predicting integrated circuit reliability according to the present invention.

Figure 6:
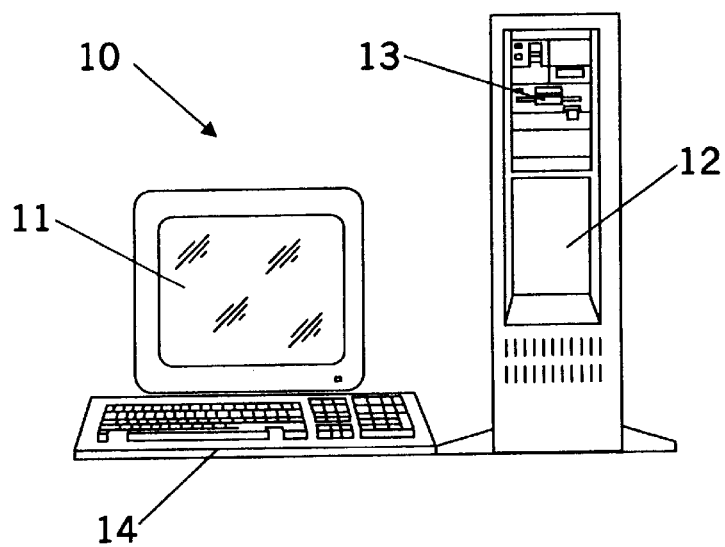
FIG. 6 illustrates a data processing workstation on which the present invention may be practiced.

Referring to FIG. 6, a data processing workstation 10 preferably includes a two-dimensional graphical display (also referred to as a "screen") 11 and a central processing unit 12. The central processing unit contains a microprocessor (not shown) and random access memory (not shown) for storing programs therein for processing by the microprocessor. A disk drive 13 for loading programs may also be provided. A keyboard 14 having a plurality of keys thereon is connected to the central processing unit 12. It will also be understood by those having skill in the art that one or more (including all) of the elements/steps of the present invention may be implemented using software executing on a general purpose data processing system, using special-purpose integrated circuit design workstations, or using combinations of special purpose hardware and software.

FIGS. 7–10 and 13–15 are flowchart illustrations of methods, apparatus (systems) and computer program products according to the invention. It will be understood that each block of the flowchart illustrations, and combinations of blocks in the flowchart illustrations, can be implemented by computer program instructions. These computer program instructions may be loaded onto a computer or other programmable data processing apparatus to produce a machine, such that the instructions which execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer instructions.

Figure 7:
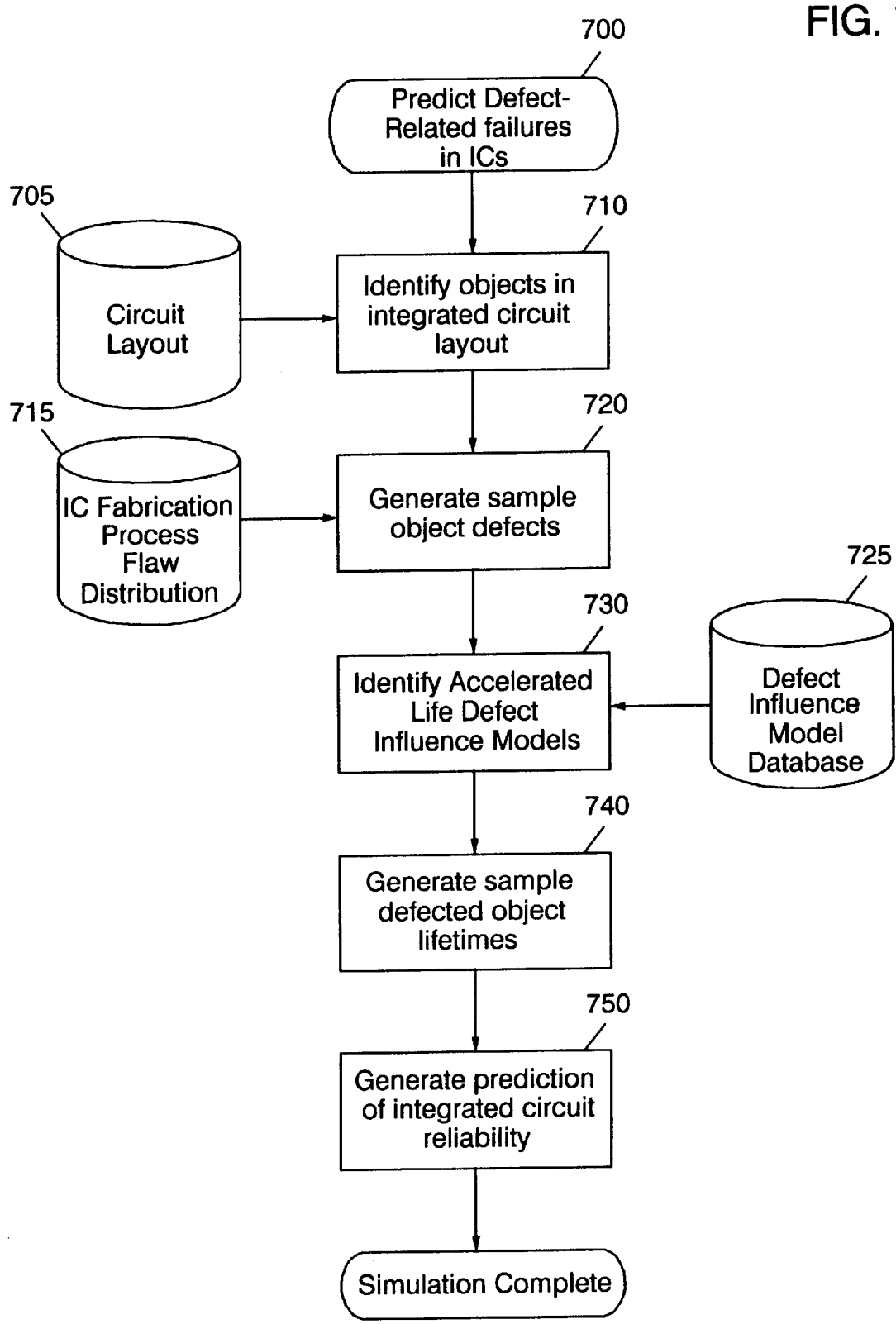
FIG. 7 illustrates operations for predicting defect-related integrated circuit failures according to the present invention.

FIG. 7 illustrates operations to be performed in a data processing system such as the data processing workstation 10 described above, for predicting reliability of integrated circuits produced by an integrated circuit fabrication process according to an integrated circuit design (Block 700). A plurality of objects in the integrated circuit design is identified from a circuit layout 705 for the integrated circuit design (Block 710), for example, from a database maintained by a standard software package for designing integrated circuits, such as MentorGraphics' V8 IC Station. Each of the identified objects has a location and reliability connectivity in the integrated circuit associated therewith. A plurality of sample object defects representing defects in instances of identified objects which are attributable to the integrated circuit fabrication process are then generated (Block 720), for example, by sampling from process flaw distributions 715 for the integrated circuit fabrication process. Each of the generated sample object defects has a defect type and a defect magnitude associated therewith. Accelerated life defect influence models are then identified for sample object defects (Block 730) from, for example, a database 725 of defect influence models. Each accelerated life defect influence model represents an influence of the defect magnitude of a defect on a type of object, as described in the preceding overview. Sample object lifetimes are then determined for the sample object defects from the defect magnitudes of the sample object defects according to the corresponding accelerated life defect influence models (Block 740). A prediction of the reliability of integrated circuits produced by the integrated circuit fabrication process according to the integrated circuit design is then generated from the sample object lifetimes and the reliability connectivity associated with the identified objects in the integrated circuit design (Block 750).

Those skilled in the art will appreciate that various configurations may be used with the present invention to generate a reliability prediction as depicted in FIG. 7. For example, an IC layout may be directly decomposed into component objects, sample object defects generated for the object, and all of the objects combined en masse, based on reliability connectivity, to determine overall integrated circuit reliability. However, such an approach may be computationally intractable, as the number of objects involved in a computation of overall IC reliability may exceed the memory capacity of the data processing system.

Figure 8:
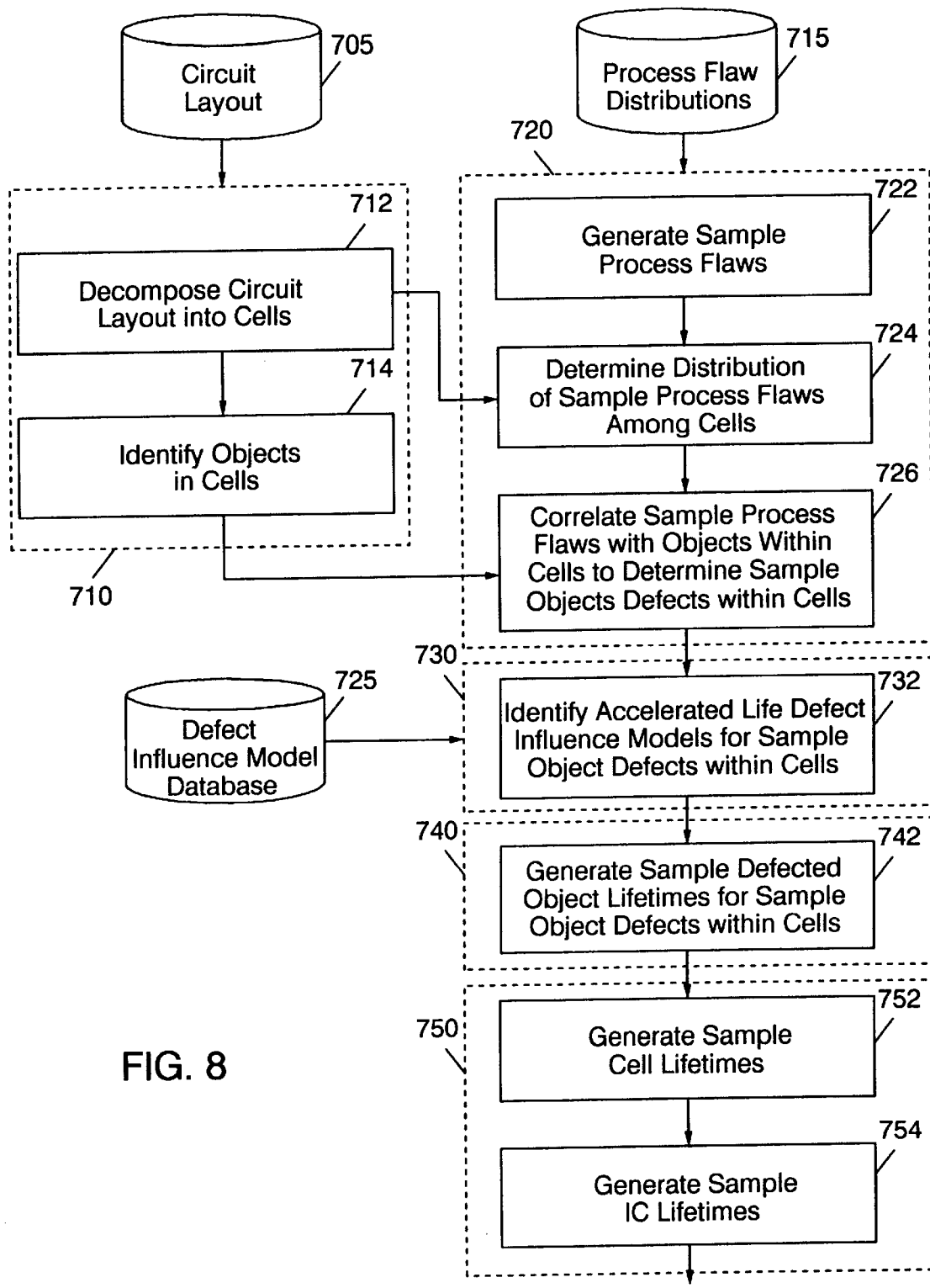
FIG. 8 illustrates operations for predicting defect-related integrated circuit failures according to a preferred cellular decomposition aspect of the present invention.

Accordingly, FIG. 8 illustrates a preferred hierarchical embodiment according to the present invention, in which a divide-and-conquer strategy is pursued, following along the lines of the graph-theoretical simulation approach described in the overview. The operations of Block 710 of FIG. 7 are broken down into operations of decomposing the circuit layout 705 into cells (Block 712), and identifying objects in cells (Block 714), the cells representing blocks of layout which may include objects. Cells may hierarchically include instances of other cells, i.e., sub-cells, while some cells may be primitive cells which include only objects.

The operation of generating sample object defects (Block 720 of FIG. 7) may be performed as successive operations of sample process flaw generation (Block 722), determination of distribution of sample process flaws among cells (Block 724), and the correlation of sample process flaws falling within each cell with objects in the cell, to thereby determine sample object defects, i.e., which objects are defected by sample process flaws, and if so, the magnitude of the defect produced by the sample process flaw (Block 726).

The operations of identifying defect influence models (Block 730 of FIG. 7) and generating sample object lifetimes (Block 740 of FIG. 7) may then be performed on a per-cell basis (Block 732 and Block 742, respectively), thus allowing for reduced computational complexity. Once sample object lifetimes are generated for each cell, the operation of generating a reliability prediction for ICs (Block 750 of FIG. 7) may be broken down into operations of generating sample cell lifetimes for each cell based on the sample object lifetimes for objects in the cell and their associated reliability connectivity for the cell (Block 752), and generating sample IC lifetimes based on the sample cell lifetimes and the reliability connectivity associated with each cell (Block 754).

As described in the overview, sample process flaws may be produced by sampling the process flaw distributions 715. The process flaw distributions may be directly measurable, for example, defects measured by direct process monitoring, or may be indirectly inferable, for example, by deduction from electrical measurements or other tests. Preferably, the process flaw distributions include a process flaw magnitude distribution, a process flaw spatial distribution and a process flaw quantity distribution, in order to determine location and size of object defects produced by the flaws. Each of the process flaws preferably has an associated magnitude and location with respect to the integrated circuit layout.

Distribution of the sample process flaws among the cells may be determined by associating an area with each cell, and determining into which of the areas each sample process flaw falls. As discussed in the overview, the correlation of the sample process flaws with objects may utilize the concept of critical area to determine the presence of a defect. Identified objects may have critical areas, generated sample flaws may have associated areas, and sample object defects may be generated if the area of a sample flaw intersects the critical area of an object. The resulting sample object defect may have a magnitude representing the area of intersection, e.g., as with a particulate-induce subtractive defect, or may involve a more indirect relationship between flaws and defect magnitude.

As discussed in the overview, the defect influence models applied to the sample object defects may take several forms. According to a preferred aspect, the accelerated life defect influence models preferably are log-linear regression models relating object lifetime to a q×1 defect influence vector which includes object defect magnitude, and having the form:

$$\ln T = \mu_0 - \beta^T \zeta + \epsilon, \qquad (22)$$

as discussed above. Those skilled in the art will understand that this model may include other parameters relevant to object failure, such as "on chip" stress conditions and the like.

Figures 9, 12:
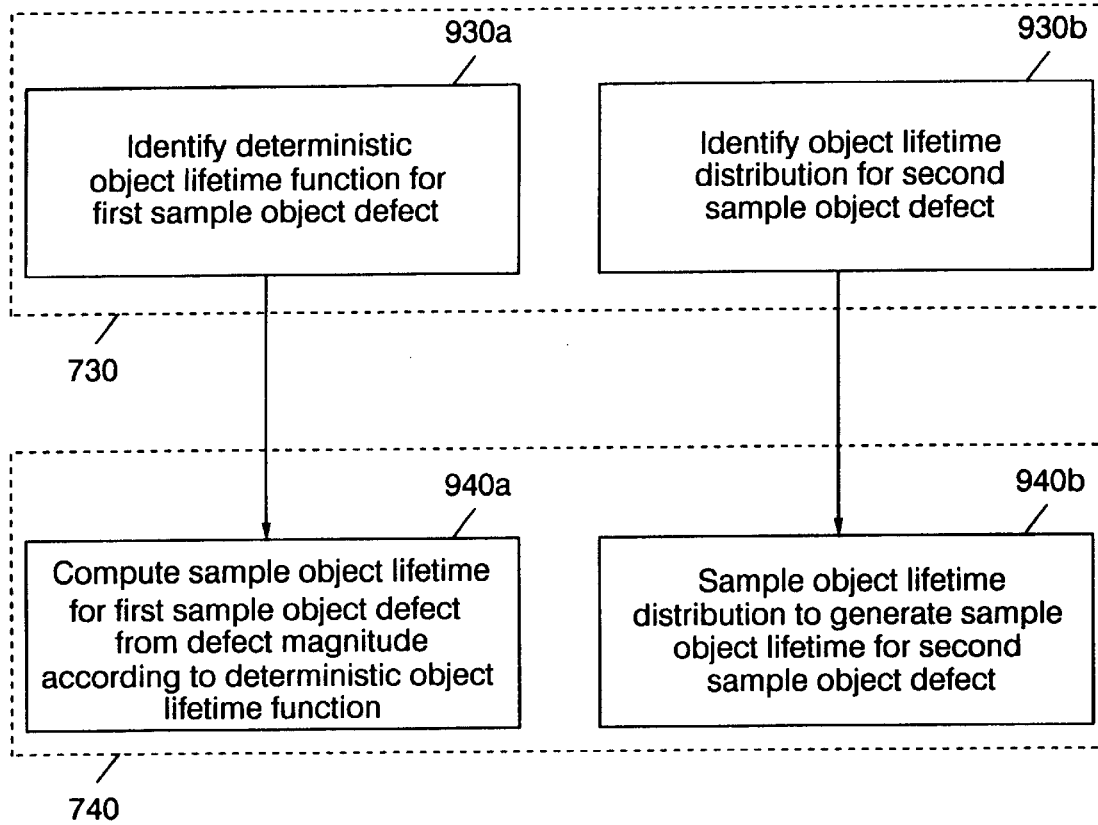
FIG. 9 illustrates operations for using different accelerated life defect influence models according to the present invention.
FIG. 12 illustrates calibration scenarios according to calibration aspects of the present invention.

As illustrated in FIG. 9, the accelerated life defect influence model used for determining a sample object lifetime corresponding to a sample object defect may be a deterministic object lifetime function, e.g., a determination "physics of failure" model like those described for metal run and gate oxide failures, and a non-monotonic object lifetime distribution which relates a defect magnitude to a plurality of object lifetime values. For a first sample object defect for which a deterministic defected object lifetime function is identified (Block 930a), a sample object lifetime is computed from the defect magnitude of the sample object lifetime according to the deterministic object lifetime function (Block 940a). For a second sample object defect for which an object lifetime distribution is identified (Block 930b), a sample object lifetime is generated by sampling from the object lifetime distribution (Block 940b).

Figure 10:
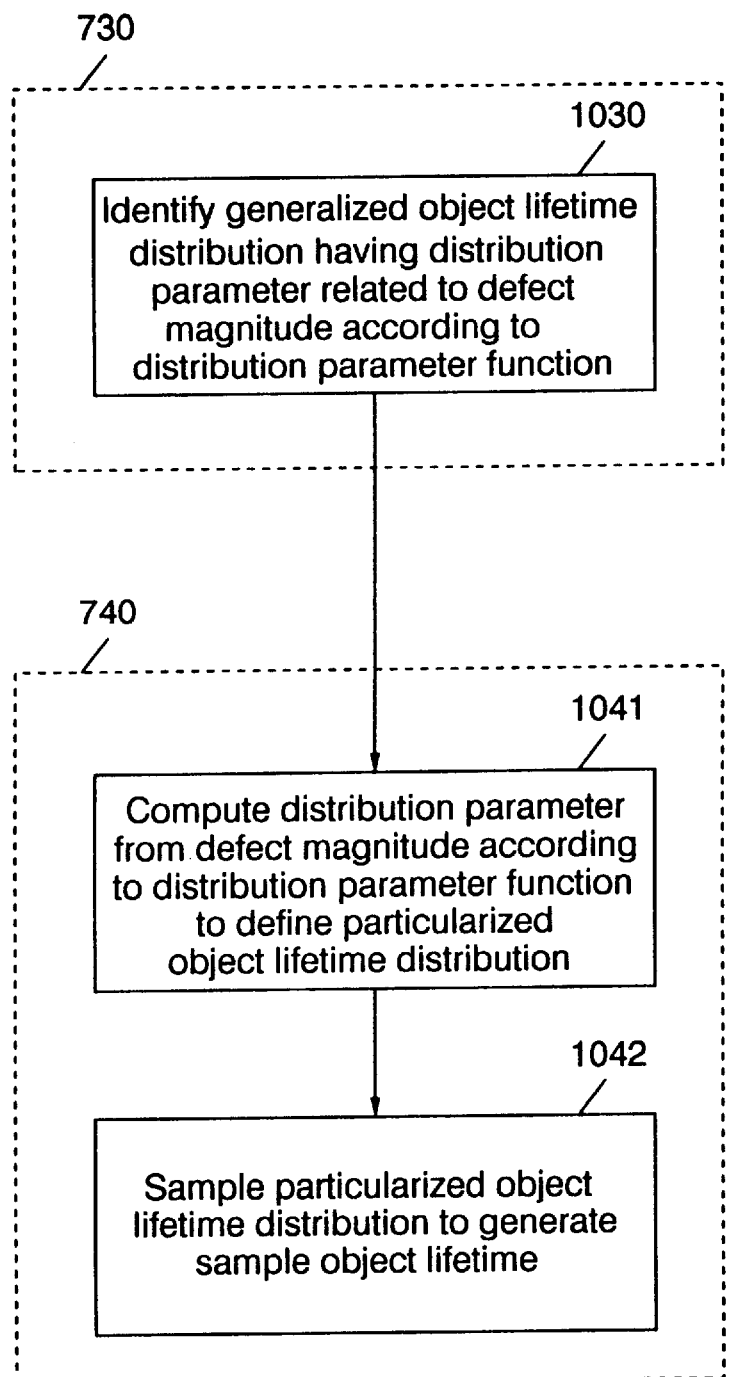
FIG. 10 illustrates operations for determining a sample object lifetime according to the present invention.

As illustrated in FIG. 10, an object lifetime distribution for a sample object defect may include a generalized parametric object lifetime distribution function having a distribution parameter related to defect magnitude by a distribution parameter function (Block 1030). A sample object lifetime for such a sample object defect may be generated by computing the distribution parameter from the defect magnitude according to the distribution parameter function to thereby generate a particularized object lifetime distribution (Block 1041), and then sampling the particularized object lifetime distribution to generate the sample object lifetime (Block 1042). Similarly, the generalized object lifetime distribution may be parameterized based on defect magnitude and a conditional probability factor independent of the generalized object lifetime distribution, for example, the morphology of an object at a sample object defect location, and a sample object lifetime may be generated based on the defect magnitude and the conditional probability factor in the manner of FIG. 10.

Figure 11:
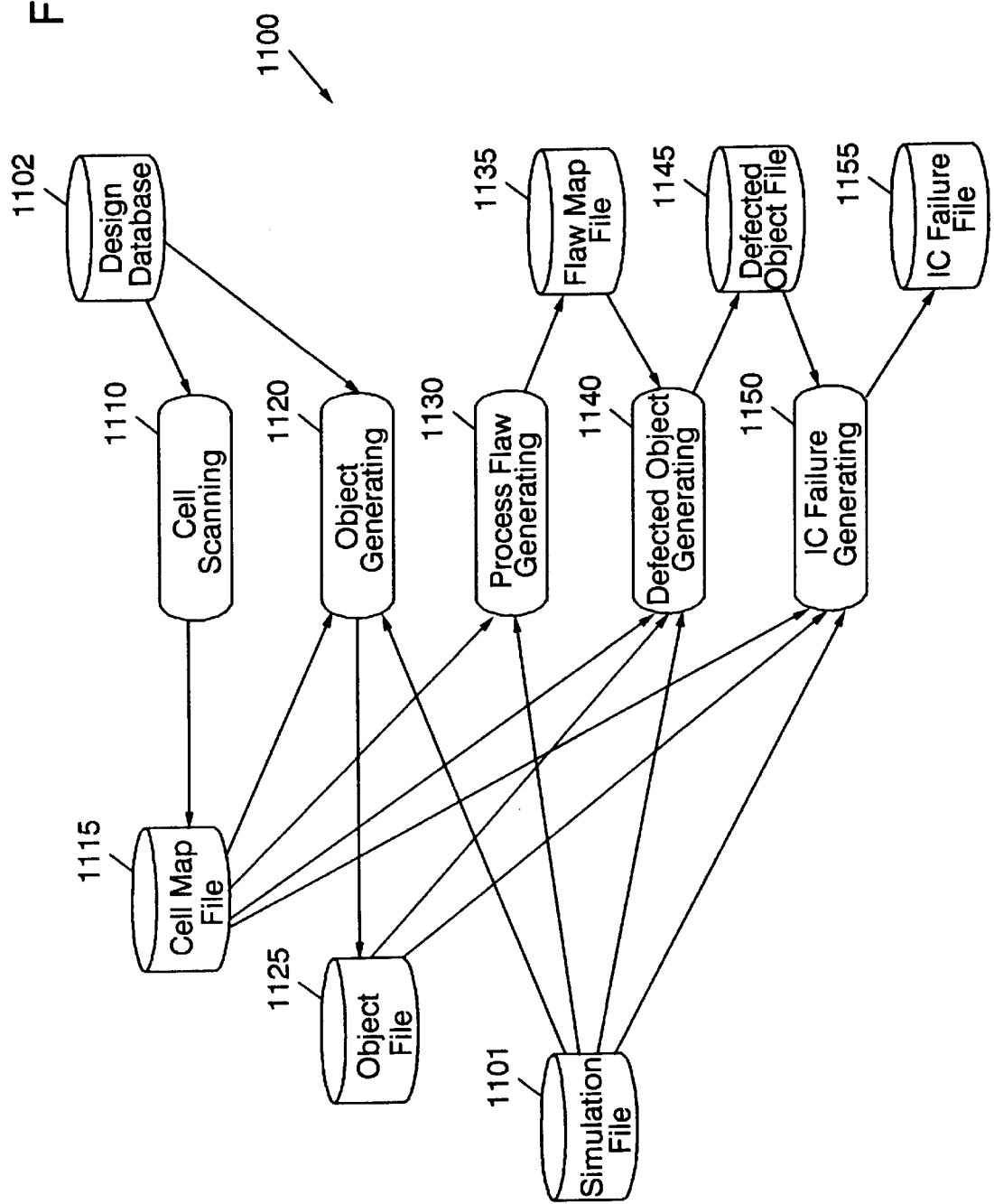
FIG. 11 illustrates an exemplary modular computer program embodiment according to the present invention.

FIG. 11 illustrates a computer program embodiment of an integrated circuit reliability simulator 1100 according to the present invention implemented and tested by the inventors, designed to interface with the MentorGraphics V8 IC Station integrated circuit design system. Input to the simulation program includes a design database 1102 and a simulation file 1101 containing simulation directives. Preferably, the database 1102 is in MentorGraphics' ICGraph® database format, which allows simple and compound objects to be annotated with user-defined properties and data from programs such as those for schematic capture and circuit simulation, and with reliability connectivity encoded via the user-defined property mechanism. Those skilled in the art will understand that EDIF, GDSII, CIF or other formats may also be used, with appropriate conversions. The simulation file 1101 may describe, for example, the type of objects to be included, the flaw distributions to be used and their respective parameter values, the defect influence models and their parameters, and the number of samples to be taken for a failure mechanism for which simulation is desired.

In the computer program of FIG. 11, each instance of a cell is uniquely labeled, and its instantiation represents both the spatial positioning of a set of distinguishable objects in the IC, and their inclusion in the overall integrated circuit reliability connectivity graph. A cell scanning module 1110 creates a cell map file 1115 including a list of bounding-boxes of all the cells and their instances in the layout, and their reliability connectivity. An object generating module 1120 interprets simulation file directives indicating the boolean composition of object types from mask layers, and generates an object file 1125 containing descriptions of objects for each unique cell.

A process flaw generating module 1130 generates a flaw map file 1135 including process flaws, assigning them random magnitudes and locations according to specified distributions. The instance bounding-box data for cells is used to determine into which instances flaws fall. The impact of the generated flaws on objects is analyzed by a defected object generating module 1140, to determine which objects are affected and the magnitude of the resulting defects, storing the results in a defected object file 1145. Finally, an integrated circuit sample lifetime generating module 1150 computes cell instance lifetimes and merges these to generate sample integrated circuit lifetimes, which are output to an IC lifetime file 1155.

Those skilled in the art will appreciate that functions of the above described modules may be partitioned in other ways. For example, operations for generating a sample object lifetime according to an accelerated life defect influence model as described above may be incorporated in a computer program product for use with the apparatus and methods described herein, for example, for use with the computer program 1100 described in FIG. 11. This computer program product may include a computer-readable storage medium, including computer-readable program code means for generating a sample object lifetime from the defect magnitude of a sample object defect according to the accelerated life defect influence model, and may be implemented, for example, using a modular subroutine library, object library or other programming techniques.

B. Calibration

As those skilled in the art will appreciate, calibration may be viewed as the process of arriving at a set of simulation parameters that, when used during simulation, yield results that are consistent with the available data. Let P represent the set of all input parameters required for simulation. In particular, P may include, for all objects and for each mechanism m, the parameters of both $T_o(\zeta)$ and $f(\delta)$, and N. For such P, consistency may be defined such that for some arbitrary constant $\epsilon$, $$\lim_{N \to \infty} Pr\{|F_G(t) - \hat{F}_G(t;P)| > \epsilon\} \to 0; \tag{38}$$

i.e., given P, the probability that the true and estimated values of system reliability differ by more than some constant becomes infinitesimally small as the number of samples used in Monte Carlo integration increases indefinitely.

Figure 13:
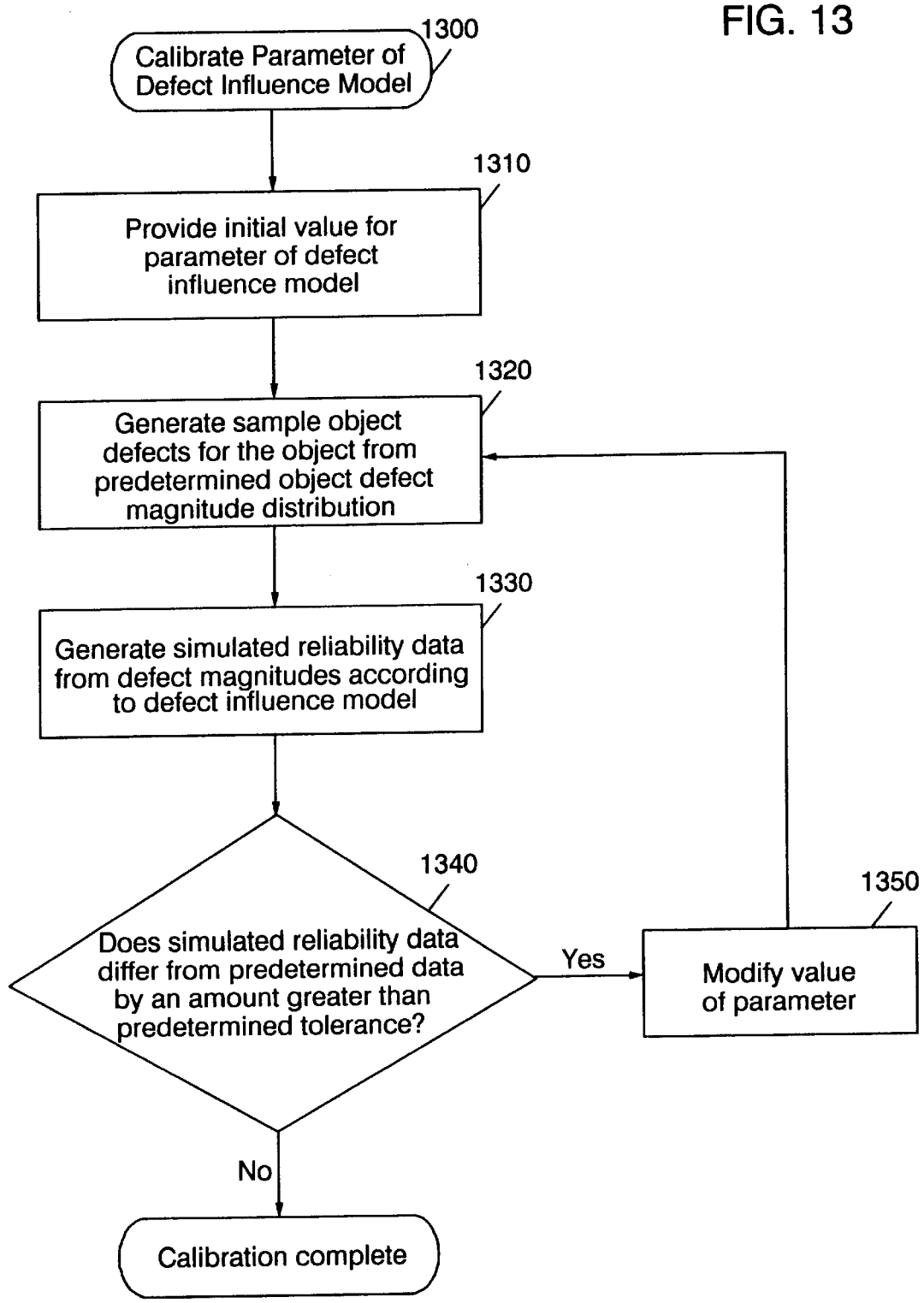
FIG. 13 illustrates operations for calibrating a defect influence model parameter according to the present invention.

As those skilled in the art will understand, depending on the data available, the calibration problem may involve a range of issues, including the design of experiments, e.g., test structures and lifetests, appropriate to early failure detection and characterization. FIG. 12 provides a summary of calibration scenarios wherein attention is restricted to determining parameters in P related to $T_o(\zeta)$ or $f(\delta)$ As illustrated in FIG. 13, assuming that failure mechanisms may be individually calibrated, a procedure (Block 1300) may be developed for calibrating a parameter of a defect influence model employed in reliability prediction based on predetermined reliability data and iterative simulation. An initial value is provided for the parameter (Block 1310), for example, using a value based on models for similar processes or designs. Simulations are then iteratively performed, with the simulation output being compared to a reference value after each iteration to determine if further modification of the model parameter is needed (Blocks 1320, 1330, 1140, 1150). Adjustment may occur, for example, through the use of nonlinear optimization techniques, until the simulated output and some reference value agree to within a given tolerance level.

For example, calibration of parameters of $T_o(\zeta)$ for a known $F_d(t)$ and $f(\delta)$, i.e. scenario B of FIG. 6, may involve assuming a functional relationship of the form of Equation (22), and measuring data for $F_d(t)$ using a test object structure. From a layout for the test object, simulations are iteratively performed until the parameters of $T_o(\zeta)$ are calibrated.

Those skilled in the art will understand that if simulation is performed for an object having a layout the same as the test object for which measured values for $F_d(t)$ are obtained, then $\hat{F}_G(t)$ (Equation 36) may be used as an estimator of G. If there are Q discrete time points at which $F_d(t)$ is measured and at which $F_G(t)$ is computed by the simulation, then the calibration task may be cast as $$\min_{P} \sum_{i=1}^{Q} \rho(F_d(t_i) - \hat{F}(t_i;P)), \tag{39}$$

where $$\rho(a) = \log(1 + \tfrac{1}{2}a^2). \tag{40}$$

Those skilled in the art will appreciate that the particular estimator given in Equation (40) generally is robust; those skilled in the art will appreciate that other estimators may be used with the present invention. The minimization problem may be solved, for example, using a downhill simplex algorithm. Many such algorithms are well-known to those skilled in the art, and need not be discussed in further detail herein.

Figure 14:
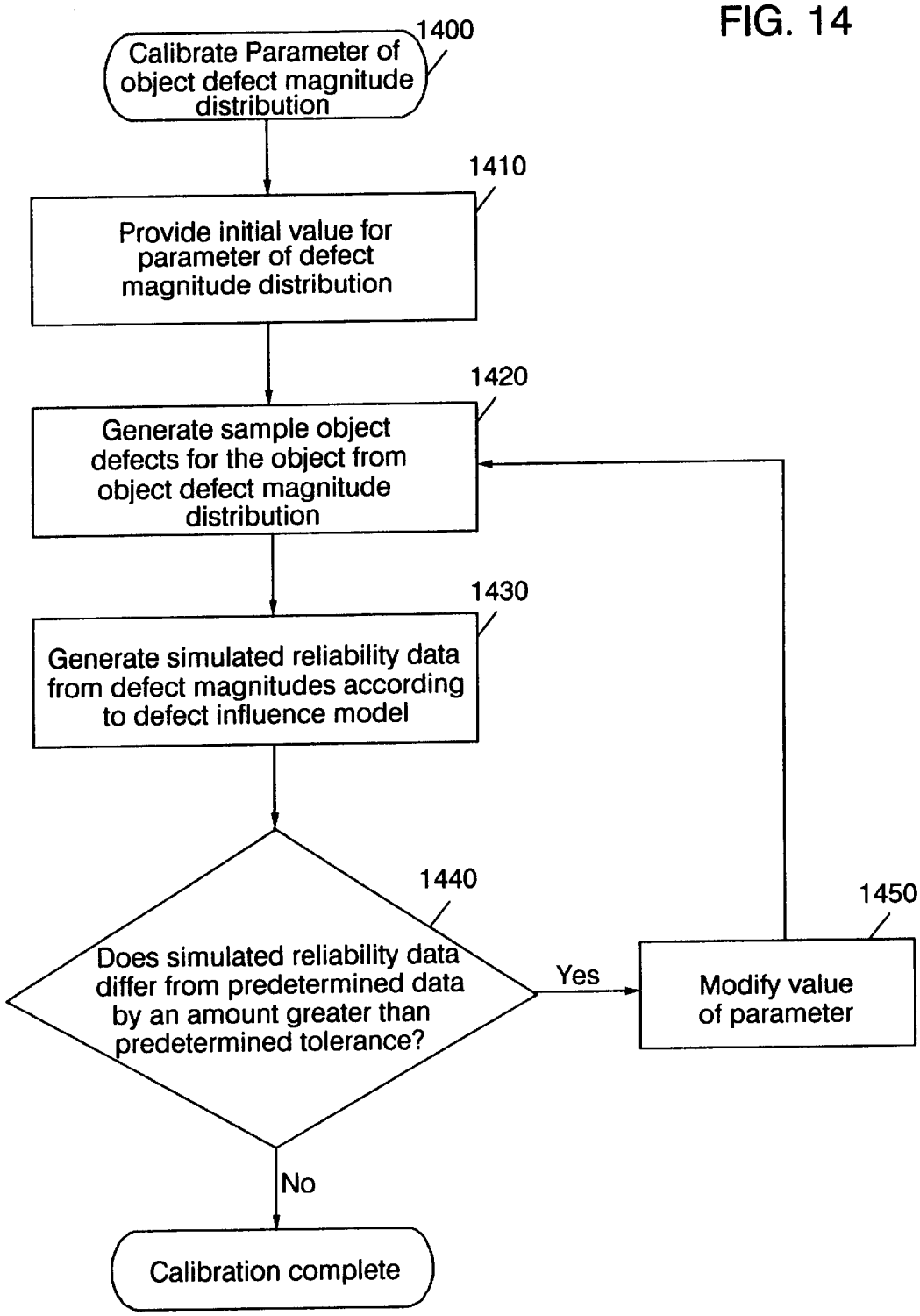
FIG. 14 illustrates operations for calibrating an object defect magnitude distribution according to the present invention.

Similarly, as illustrated in FIG. 14, a parameter of an object magnitude distribution may be calibrated (Block 1400). An initial value for the parameter is provided, for example, from data for similar objects and/or processes (Block 1410). Sample object defects are generated according to the object magnitude distribution using the current parameter value (Block 1420). Simulated reliability data is then generated from the defect magnitudes of the sample object defects according to a defect influence model (Block 1430). The parameter value is modified until the simulated reliability data differs from predetermined reliability data by less than a predetermined tolerance (Blocks 1440, 1450).

Scenarios A and D of FIG. 10 relate to cases when a model relating $T_o(\zeta)$ to $F_i(t)$ is desired. In scenario C, although it may be desirable to use functions for $T_o(\delta)$ which are physically justified, functions could be used which have no physical basis. For example, it may be determined that a non-deterministic model represented by a lognormal distribution with a $t_{50}$ of 30000 hrs, and a variance equal to that of the intrinsic failures fit measured data. Such a model may be incrementally refined, especially if data on different ICs is available, allowing predictions to be made for new products without reference to $F_d(t)$. The model may be assumed to hold so long as $f(\delta)$ and the associated failure mechanism is stable for products fabricated in a given process. Those skilled in the art will appreciate that Bayesian models may be useful in this context.

Similarly, the scenarios E and F could be solved with an $f(\delta)$ that is not physically measurable or physically justified. In particular, particulates or point-defects could be used, and similar incremental refinement would lead to confidence in predictions on new products, as described above.

C. Performance Analysis

Let $n_I$ be the total number of cell instances in the integrated circuit and $n_{oi}$ be the number of objects contained within the instance $$i_j n_0 = \sum_{i=1}^{nI} n_{oi}.$$

The worst-case scenario from a memory requirement viewpoint will generally occur if the layout is completely flattened, with the maximum number of objects in memory at one time being $O(n_o)$. However, if hierarchy is assumed to exist, then the maximum space occupied may be estimated by:

$$O(\max_i \{n_I, \max n_{oi}\}). \tag{41}$$

Referring to FIG. 11, most time will typically be spent either in object generation (Block 1120) or defect generation (Blocks 1130, 1140). Defect generation occurs in two phases (Blocks 1130, 1140). In the first phase, generation of a defect map (Block 1130), the time spent may be given by $O(N \log_2 n_I)$ if $N>n_I$, since region queries take $O(\log_2 n_I)$ and random variate generation takes approximately constant time. The second phase, generation of defected objects (Block 1140), may be estimated to take a worst-case time of $O(N \log_2 n_0)$ if $N>n_0$, or $O(n_0 \log_2 n_0)$ if $n_0>N$, the latter occurring if the layout is flattened or if every instance were to be defected. The time to analyze the effect of a flaw may be estimated as being constant, although it actually may be a function of the number of vertices of the polygon defining the object being analyzed. Assuming that $N>n_0>n_I$, defect generation may be estimated to consume $O(N \log_2 n_0)$ time. Object generation has time complexity of $O(n_0^{1.5})$. Hence the overall time complexity may be estimated as $$O(\max\{N \log_2 n_0, n_0^{1.5}\}), \tag{42}$$

approximately proportional to the confidence level required in the final results.

D. Applications

Figure 15:
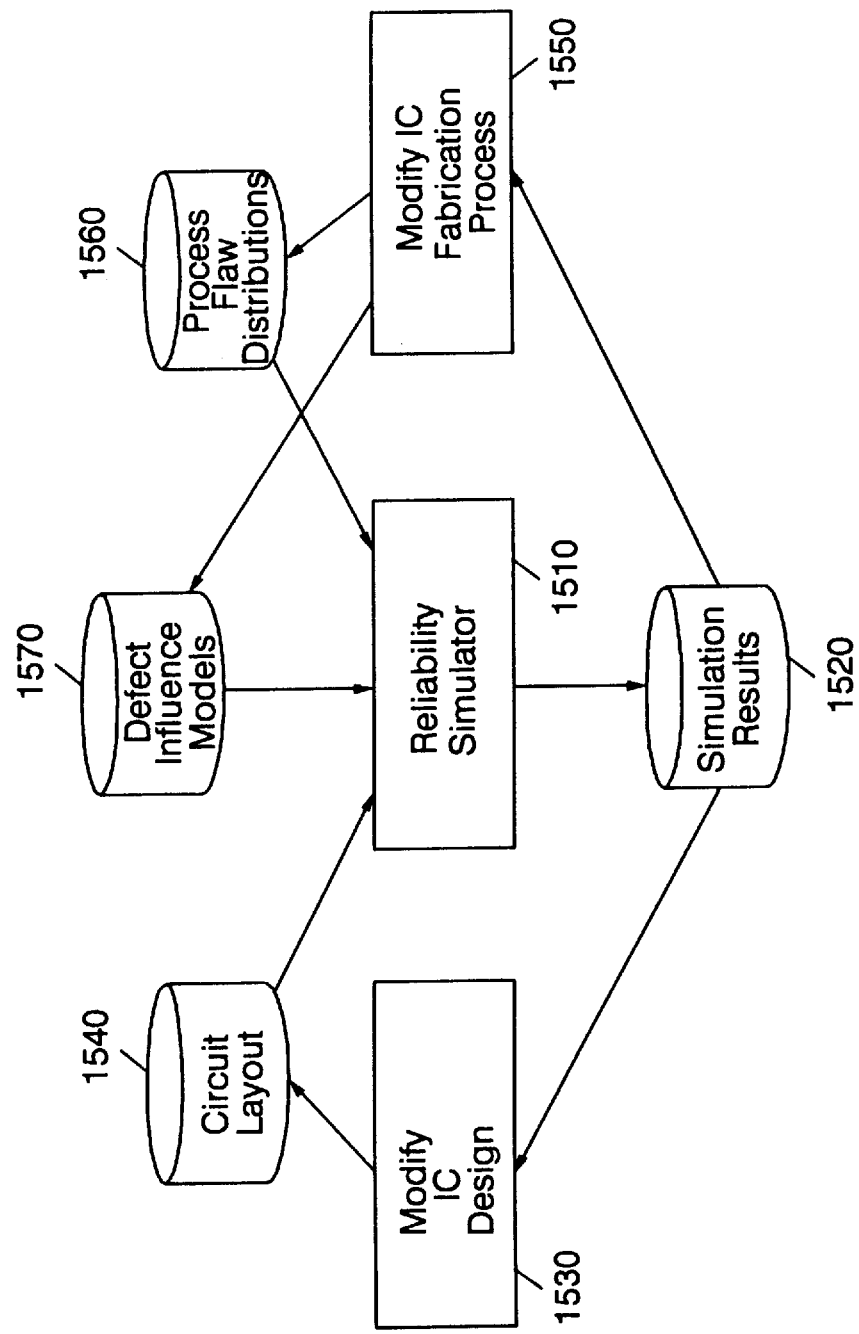
FIG. 15 illustrates operations for modifying an integrated circuit design and for modifying an integrated circuit fabrication process according to the present invention.

A schematic view of the application of the simulator is presented in FIG. 15. As illustrated, the simulation results 1520 output from a reliability simulator 1510 according to the present invention may be used to iteratively modify an integrated circuit design (Block 1530), and thus modify the integrated circuit layout 1540 for the design. Similarly, the reliability simulator 1510 may be used to iteratively modify an IC fabrication process (Block 1550), and thus the process flaw distributions 1560 characterizing the process 1550 and/or the detect influence models 1570. Those skilled in the art will appreciate that the simulator 1510 may be used for other process qualification, design assessment, fabrication monitoring tasks, as well as other integrated circuit design and manufacturing tasks.

For example, to qualify a process, target reliability figures for a standard test chip operating under stated conditions may be agreed upon, such that the factors which affect reliability will be the defect levels in the fabricated objects constituting the chip, and their extrinsic lifetimes. Defect levels contributed by different process steps may be identified and used as inputs to the simulator. If the process is still under development, past experience with similar equipment may provide tentative data on which to base projections. Similarly, lifetests may be performed on different object types and the results fed to the simulator. Correlation between process monitors and reliability may also be performed at this stage. Simulation output may then be used to verify that expected reliability goals may be met and, by presenting a ranked list of failure rate adders, may prioritize those process steps and/or subsystems that most significantly impact the reliability for further improvement.

Integrated circuit design assessment may be performed in the context of a known set of mature processes being available to produce a given design, or a set of alternative designs of the same product being considered for volume production. In either case, the target process detect distributions and the reliability of their as fabricated objects preferably will be well characterized, allowing various possible design and fabrication process alternatives to be assessed for compliance to given reliability specifications. Again, ranked simulation outputs can be used to highlight potential sources of improvement if more aggressive goals are required and not being achieved. The effect of different design rules can also be gauged.

To monitor fabrication processes for a fixed design with validated simulation models, wafer-level process monitors that capture defect level information and fabricated object reliability data which can be input to the simulator, as subsystems are produced, to determine whether eventual reliability goals for the complete chip will be met. Standard statistical process control procedures may also be employed to interpret simulation outputs.

The inductive capability offered by the present invention can be invaluable in dealing with the evolution of integrated circuit designs and fabrication processes. Typically, neither $T_o(\zeta)$ nor $f(\delta)$ are known for a new design. However, it may be possible to design test structures that increase the likelihood of observing extrinsic failures, and thus non-linear regression equations for $T_o(\zeta)$ and $f(\delta)$ may be set up for solution. Correlation studies can be performed investigating the relationship between $f(\delta)$ and suspected sources of defectivity, and a method for defect detection can be synthesized. Furthermore, if the model evolves along with the process, at the end of process development, the model may be applied to new IC designs.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of predicting defect-related failures in integrated circuits produced by an integrated circuit fabrication process according to a circuit layout for an integrated circuit design, the method comprising the following steps which are performed in a data processing system:

identifying objects in the circuit layout, each object having a location in the circuit layout and a reliability connectivity in the integrated circuit design;

generating sample object defects for the identified objects, each sample object defect representing a defect induced in an object by the integrated circuit fabrication process, each sample object defect having a defect magnitude associated therewith;

identifying an accelerated life defect influence model for each sample object defect, each accelerated life defect influence model relating the lifetime of an object to the defect magnitude of a defect in the object;

generating sample object lifetimes from the defect magnitudes associated with the sample object defects according to the corresponding identified accelerated life defect influence models; and generating a prediction of the reliability of integrated circuits produced by the integrated circuit fabrication process according to the circuit layout, from the sample object lifetimes according to the reliability connectivity of the associated objects in the integrated circuit design.

2. A method according to claim 1 wherein said step of generating a prediction of the reliability of integrated circuits comprises the step of:

generating sample integrated circuit lifetimes from the sample object lifetimes according to the reliability connectivity of the associated objects.

3. A method according to claim 1 wherein said step of identifying an accelerated life defect influence model comprises the step of identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein $\epsilon$ represents an unobservable random variable uncorrelated with $\zeta$; and wherein said step of generating sample object lifetimes comprises the step of generating a sample object lifetime corresponding to the at least one sample object defect from the defect magnitude of the at least one sample object defect according to the corresponding log-linear regression model.

4. A method according to claim 3:

wherein said step of identifying a log-linear regression model comprises the step of identifying a deterministic object lifetime function relating the defect magnitude of the at least one sample object defect to one object lifetime value; and wherein said step of generating a sample object lifetime corresponding to the at least one sample object defect comprises the step of computing a sample object lifetime corresponding to the at least one sample object defect from the defect magnitude of the at least one sample object defect according to the deterministic object lifetime function to thereby generate a sample object lifetime for the at least one sample object defect.

5. A method according to claim 3:

wherein said step of identifying a log-linear regression model comprises the step of identifying a log-linear object lifetime distribution relating the defect magnitude of a sample object defect to a plurality of object lifetime values; and wherein said step of generating a sample object lifetime corresponding to the at least one sample object defect comprises the step of sampling the log-linear object lifetime distribution to thereby generate a sample object lifetime corresponding to the at least one sample object defect.

6. A method according to claim 3:

wherein said step of identifying a log-linear regression model comprises the step of identifying a predetermined generalized parametric object lifetime distribution function derived from intrinsic reliability data and having a distribution parameter related to the defect magnitude of a sample object defect by a distribution parameter function; and wherein said step of generating a sample object lifetime corresponding to the at least one sample object defect comprises the steps of:

computing a value for the distribution parameter for the at least one sample object defect from the defect magnitude of the at least one sample object defect according to the distribution parameter function to thereby define a particularized object lifetime distribution function for the at least one sample object defect; and sampling the particularized object lifetime distribution function to thereby generate a sample object lifetime corresponding to the at least one sample object defect.

7. A method according to claim 3:

wherein said step of identifying a log-linear regression model comprises the step of identifying a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized parametric object lifetime distribution function; and wherein said step of generating a sample object lifetime corresponding to the at least one sample object defect comprises the steps of:

computing a value for the distribution parameter for the at least one sample object defect from the defect magnitude of the at least one sample object defect and the conditional probability factor according to the distribution parameter function to thereby define a particularized object lifetime distribution function for the at least one sample object defect; and sampling the particularized object lifetime distribution function to thereby generate a sample object lifetime corresponding to the at least one sample object defect.

8. A method according to claim 1:
wherein said step of identifying an accelerated life defect influence model for each sample object defect comprises the steps of:
identifying a deterministic object lifetime function relating the defect magnitude of a first sample object defect to one object lifetime value, for the first sample object defect; and
identifying an object lifetime distribution relating the defect magnitude of a second sample object defect to a plurality of object lifetime values, for the second sample object defect; and wherein said step of generating sample object lifetimes comprises the steps of:
computing an object lifetime value from the defect magnitude of the at least one sample object defect according to the deterministic object lifetime function to thereby generate a sample object lifetime corresponding to the first sample object defect; and
sampling the object lifetime relating to the defect magnitude of the second sample object defect to thereby generate a sample object lifetime corresponding to the second sample object defect.

9. A method according to claim 1:
wherein said step of identifying objects from the circuit layout comprises the steps of:
identifying cells in the circuit layout, each of the cells occupying an area of the circuit layout and having a reliability connectivity in the integrated circuit design; and
identifying objects within each cell, each of the objects within a cell having a location in the cell and a reliability connectivity in the cell;
wherein said step of generating sample object defects comprises the step of generating sample object defects for objects within the cells;
wherein said step of generating sample object lifetimes comprises the step of generating sample object lifetimes for objects within the cells; and
wherein said step of generating a prediction of the reliability of integrated circuits comprises the steps of:
generating sample cell lifetimes for cells from the sample object lifetimes for objects within the cells according to the reliability connectivity of the associated objects in the cells; and
generating a prediction of the reliability of integrated circuits produced by the integrated circuit fabrication process from the sample cell lifetimes according to the reliability connectivity of the associated cells in the integrated circuit design.

10. A method according to claim 1 further comprising the steps of:
modifying the integrated circuit design based on the predicted reliability of integrated circuits produced by the integrated circuit process according to the circuit layout; and
fabricating integrated circuits according to the modified integrated circuit design.

11. A method according to claim 1 further comprising the steps of:
modifying the integrated circuit fabrication process based on the predicted reliability of integrated circuits produced by the integrated circuit process according to the circuit layout; and
fabricating integrated circuits using the modified integrate circuit fabrication process.

12. A method of predicting defect-related failures in integrated circuits produced by an integrated circuit fabrication process according to a circuit layout for an integrated circuit design, the method comprising the following steps which are performed in a data processing system:
identifying objects in the circuit layout, each object having an object type, a location in the circuit layout and a reliability connectivity in the integrated circuit design;
providing a process flaw distribution associated with the integrated circuit fabrication process, the process flaw distribution representing a statistical distribution of flaws produced by the integrated circuit fabrication process;
generating sample flaws according to the process flaw distribution, each of the sample flaws having a location with respect to the circuit layout;
correlating the locations of the sample flaws with the locations of the identified objects to thereby generate sample object defects, each sample object defect representing a defect induced in an object by a sample flaw, each sample object defect having a defect magnitude associated therewith;
identifying an accelerated life defect influence model for each sample object defect, each accelerated life defect influence model representing an influence of the defect magnitude of a defect on the lifetime of an object;
generating sample object lifetimes for the identified objects from the defect magnitudes associated with the sample object defects according to the corresponding identified accelerated life defect influence models; and
generating a prediction of the reliability of integrated circuits produced by the integrated circuit fabrication process according to the circuit layout from the sample object lifetimes according to the reliability connectivity of the associated identified objects in the integrated circuit design.

13. A method according to claim 12 wherein said step of generating sample flaws comprises the step of sampling the process flaw distribution.

14. A method according to claim 12 wherein the process flaw distribution comprises at least one of a process flaw magnitude distribution, a process flaw spatial distribution, and a process flaw quantity distribution.

15. A method according to claim 12 wherein the process flaw distribution comprises a process flaw magnitude distribution, a process flaw spatial distribution, and a process flaw quantity distribution.

16. A method according to claim 12:
wherein said step of identifying objects comprises the step of identifying objects having a critical area associated therewith;
wherein said step of generating sample flaws comprises the step of generating sample flaws having a location and an area; and
wherein said step of correlating the locations of sample flaws with the locations of the identified objects comprises the steps of generating a sample object defect if a critical area of an object intersects the area of a sample flaw.

17. A method according to claim 12 wherein said step of identifying an accelerated life defect influence model comprises the step of identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein $\epsilon$ represents an unobservable random variable uncorrelated with $\zeta$; and wherein said step of generating sample object lifetimes comprises the step of generating a sample object lifetime corresponding to the at least one sample object defect from the defect magnitude of the at least one sample object defect according to the corresponding log-linear regression model.

18. A method according to claim 17:

wherein said step of identifying a log-linear regression model comprises the step of identifying a deterministic object lifetime function relating the defect magnitude of a sample object defect to one object lifetime value; and wherein said step of generating a sample object lifetime corresponding to the at least one sample object defect comprises the step of computing a sample object lifetime corresponding to the at least one sample object defect from the defect magnitude of the at least one sample object defect according to the deterministic object lifetime function to thereby generate a sample object lifetime for the at least one sample object defect.

19. A method according to claim 17:

wherein said step of identifying a log-linear regression model comprises the step of identifying a log-linear object lifetime distribution relating the defect magnitude of a sample object defect to a plurality of object lifetime values; and wherein said step of generating a sample object lifetime corresponding to the at least one sample object defect comprises the step of sampling the log-linear object lifetime distribution to thereby generate a sample object lifetime corresponding to the at least one sample object defect.

20. A method according to claim 17:

wherein said step of identifying a log-linear regression model comprises the step of identifying a predetermined generalized parametric object lifetime distribution function derived from intrinsic reliability data and having a distribution parameter related to the defect magnitude of a sample object defect by a distribution parameter function; and wherein said step of generating a sample object lifetime corresponding to the at least one sample object defect comprises the steps of:

computing a value for the distribution parameter for the at least one sample object defect from the defect magnitude of the at least one sample object defect according to the distribution parameter function to thereby define a particularized object lifetime distribution function for the at least one sample object defect; and sampling the particularized object lifetime distribution function to thereby generate a sample object lifetime corresponding to the at least one sample object defect.

21. A method according to claim 17:

wherein said step of identifying a log-linear regression model comprises the step of identifying a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized parametric object lifetime distribution function; and wherein said step of generating a sample object lifetime corresponding to the at least one sample object defect comprises the steps of:

computing a value for the distribution parameter for the at least one sample object defect from the defect magnitude of the at least one sample object defect and the conditional probability factor according to the distribution parameter function to thereby define a particularized object lifetime distribution function for the at least one sample object defect; and sampling the particularized object lifetime distribution function to thereby generate a sample object lifetime corresponding to the at least one sample object defect.

22. A method according to claim 12:

wherein said step of identifying an accelerated life defect influence model for each sample object defect comprises the steps of:

identifying a deterministic object lifetime function relating the defect magnitude of a first sample object defect to one object lifetime value, for the first sample object defect; and identifying an object lifetime distribution relating the defect magnitude of a second sample object defect to a plurality of object lifetime values, for the second sample object defect; and wherein said step of generating sample object lifetimes comprises the steps of:

computing an object lifetime value from the defect magnitude of the at least one sample object defect according to the deterministic object lifetime function to thereby generate a sample object lifetime corresponding to the first sample object defect; and sampling the object lifetime relating to the defect magnitude of the second sample object defect to thereby generate a sample object lifetime corresponding to the second sample object defect.

23. A method according to claim 12:

wherein said step of identifying objects from the circuit layout comprises the steps of:

identifying cells in the circuit layout, each of the cells occupying an area of the circuit layout and having a reliability connectivity in the integrated circuit design; and identifying objects within each cell, each of the objects within a cell having a location in the cell and a reliability connectivity in the cell;

wherein said step of generating sample object defects comprises the step of generating sample object defects for objects within the cells;

wherein said step of generating sample object lifetimes comprises the step of generating sample object lifetimes for objects within the cells; and wherein said step of generating a prediction of the reliability of integrated circuits comprises the steps of:

generating sample cell lifetimes for cells from the sample object lifetimes for objects within the cells according to the reliability connectivity of the associated objects in the cells; and generating a prediction of the reliability of integrated circuits produced by the integrated circuit fabrication process from the sample cell lifetimes according to the reliability connectivity of the associated cells in the integrated circuit design.

24. A computer program product, comprising:

a computer-readable storage medium having computer-readable program code means embodied in said medium, said computer-readable program code means comprising:

first computer-readable program code means for storing a circuit layout for an integrated circuit design;

second computer-readable program code means, responsive to said first computer-readable program code means, for identifying objects in the circuit layout, each object having a location in the circuit layout and a reliability connectivity in the integrated circuit design;

third computer-readable program code means, responsive to said second computer-readable program code means, for generating sample object defects for the identified objects, each sample object defect representing a defect induced in an object by an integrated circuit fabrication process producing integrated circuits according to the circuit layout, each sample object defect having a defect magnitude associated therewith;

fourth computer-readable program code means, responsive to said third computer-readable computer program code means, for identifying an accelerated life defect influence model for each sample object defect, each accelerated life defect influence model relating the lifetime of an object to the defect magnitude of a defect in the object;

fifth computer-readable program code means, responsive to said third and fourth computer-readable program code means, for generating sample object lifetimes from the defect magnitudes associated with the sample object defects according to the corresponding identified accelerated life defect influence models; and sixth computer-readable program code means, responsive to fifth computer-readable program code means, for generating a prediction of the reliability of integrated circuits produced by the integrated circuit fabrication process according to the circuit layout from the sample object lifetimes according to the reliability connectivity of the associated objects in the integrated circuit design.

25. A computer program product according to claim 24 wherein said fourth computer-readable program code means comprises seventh computer-readable program code means for identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein $\epsilon$ represents an unobservable random variable uncorrelated with $\zeta$; and wherein said fifth computer-readable program code means comprises eighth computer-readable program code means for generating a sample object lifetime corresponding to the at least one sample object defect from the defect magnitude of the at least one sample object defect according to the corresponding log-linear regression model.

26. A computer program product according to claim 25:

wherein said seventh computer-readable program code means comprises computer-readable program code means for identifying a deterministic object lifetime function relating the defect magnitude of a sample object defect to one object lifetime value; and wherein said eighth computer-readable program code means comprises computer-readable program code means for computing a sample object lifetime corresponding to the at least one sample object defect from the defect magnitude of the at least one sample object defect according to the deterministic object lifetime function to thereby generate a sample object lifetime for the at least one sample object defect.

27. A computer program product according to claim 25:

wherein said seventh computer-readable program code means comprises computer-readable program code means for identifying a log-linear object lifetime distribution relating the defect magnitude of a sample object defect to a plurality of object lifetime values; and wherein said eighth computer-readable program code means comprises computer-readable program code means for sampling the log-linear object lifetime distribution to thereby generate a sample object lifetime corresponding to the at least one sample object defect.

28. A computer program product according to claim 25:

wherein said seventh computer-readable program code means comprises computer-readable program code means for identifying a predetermined generalized parametric object lifetime distribution function derived from intrinsic reliability data and having a distribution parameter related to the defect magnitude of a sample object defect by a distribution parameter function; and wherein said eighth computer-readable program code means comprises:

computer-readable program code means for computing a value for the distribution parameter for the at least one sample object defect from the defect magnitude of the at least one sample object defect according to the distribution parameter function to thereby define a particularized object lifetime distribution function for the at least one sample object defect; and computer-readable program code means for sampling the particularized object lifetime distribution function to thereby generate a sample object lifetime corresponding to the at least one sample object defect.

29. A computer program product according to claim 25:

wherein said seventh computer-readable program code means comprises computer-readable program code means for identifying a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized parametric object lifetime distribution function; and wherein said eighth computer-readable program code means comprises:

computer-readable program code means for computing a value for the distribution parameter for the at least one sample object defect from the defect magnitude of the at least one sample object defect and the conditional probability factor according to the distribution parameter function to thereby define a particularized object lifetime distribution function for the at least one sample object defect; and computer-readable program code means for sampling the particularized object lifetime distribution function to thereby generate a sample object lifetime corresponding to the at least one sample object defect.

30. A computer program product according to claim 24:
wherein said fourth computer-readable program code means comprises:
computer-readable program code means for identifying a deterministic object lifetime function relating the defect magnitude of a first sample object defect to one object lifetime value, for the first sample object defect; and
computer-readable program code means for identifying an object lifetime distribution relating the defect magnitude of a second sample object defect to a plurality of object lifetime values, for the second sample object defect; and
wherein said fifth computer-readable program code means comprises:
computer-readable program code means for computing an object lifetime value from the defect magnitude of the at least one sample object defect according to the deterministic object lifetime function to thereby generate a sample object lifetime corresponding to the first sample object defect; and
computer-readable program code means for sampling the object lifetime relating to the defect magnitude of the second sample object defect to thereby generate a sample object lifetime corresponding to the second sample object defect.

31. A computer program product according to claim 24:
wherein said second computer-readable program code means comprises:
seventh computer-readable program code means for identifying cells from the circuit layout, each of the cells occupying an area of the circuit layout and having a reliability connectivity in the integrated circuit design;
eighth computer-readable program code means, responsive to said seventh computer-readable program code means, for identifying objects within each cell, each of the objects within a cell having a location in the cell and a reliability connectivity in the cell; and
wherein said third computer-readable program code means comprises computer-readable program code means for generating sample object defects for objects within the cells;
wherein said fifth computer-readable program code means comprises computer-readable program code means for generating sample object lifetimes for objects within the cells; and
wherein said sixth computer-readable program code means comprises:
ninth computer-readable program code means for generating sample cell lifetimes for cells from the sample object lifetimes for objects within the cells according to the reliability connectivity of the associated objects in the cells; and tenth computer-readable program code means, responsive to said ninth computer-readable program code means, for generating a prediction of the reliability of integrated circuits produced by the integrated circuit fabrication process from the sample cell lifetimes according to the reliability connectivity of the associated cells in the integrated circuit design.

32. A method of predicting defect-related failures in integrated circuits produced by an integrated circuit fabrication process according to a circuit layout for an integrated circuit design, the circuit layout including a plurality of objects, each object having a location in the circuit layout and a reliability connectivity in the integrated circuit design, the method comprising the following steps which are performed in a data processing system:

generating sample object defects for the plurality of objects, each sample object defect representing a defect induced in an object by the integrated circuit fabrication process, each sample object defect having a defect magnitude associated therewith;

identifying a defect influence model for each sample object defect, each defect influence model relating the reliability connectivity of an object to the defect magnitude of a defect in the object;

generating a prediction of the reliability of instances of the plurality of objects having the sample object defects from the defect magnitudes associated with the sample object defects according to the corresponding identified defect influence models; and generating a prediction of the reliability of integrated circuits produced by the integrated circuit fabrication process according to the circuit layout, from the prediction of the reliability of the instances of the plurality of objects according to the reliability connectivity of the associated objects in the integrated circuit design.

33. A method according to claim 32:
wherein said step of identifying a defect influence model comprises the step of identifying an accelerated life defect influence model relating the magnitude of a defect in an object to a lifetime for the object;
wherein said step of generating a prediction of the reliability of instances of the plurality of objects comprises the step of generating sample object lifetimes from the defect magnitudes associated with the sample object defects according to the corresponding identified accelerated life defect influence models; and
wherein said step of generating a prediction of the reliability of integrated circuits comprises the step of generating a prediction of the reliability of integrated circuits produced by the integrated circuit fabrication process according to the circuit layout from the sample object lifetimes according to the reliability connectivity of the associated objects in the integrated circuit design.

34. A method according to claim 32 wherein said step of identifying an accelerated life defect influence model comprises the step of identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein ε represents an unobservable random variable uncorrelated with ζ; and wherein said step of generating sample object lifetimes comprises the step of generating a sample object lifetime corresponding to the at least one sample object defect from the defect magnitude of the at least one sample object defect according to the corresponding log-linear regression model.

35. A computer apparatus for predicting defect-related failures in integrated circuits produced by an integrated circuit fabrication process according to a circuit layout for an integrated circuit design, the computer apparatus comprising:

means for storing the circuit layout;

means, responsive to said means for storing the circuit layout, for identifying objects in the circuit layout, each object having a location in the circuit layout and a reliability connectivity in the integrated circuit design;

means, responsive to said means for identifying objects, for generating sample object defects for the identified objects, each sample object defect representing a defect induced in an object by the integrated circuit fabrication process, each sample object defect having a defect magnitude associated therewith;

means, responsive to said means for generating sample object defects, for identifying an accelerated life defect influence model for each sample object defect, each accelerated life defect influence model relating the lifetime of an object to the defect magnitude of a defect in the object;

means, responsive to said means for generating sample object defects and to said means for identifying an accelerated life defect influence model, for generating sample object lifetimes from the defect magnitudes associated with the sample object defects according to the corresponding identified accelerate life defect influence models; and means, responsive to said means for generating sample object lifetimes, for generating a prediction of the reliability of integrated circuits produced by the integrated circuit fabrication process according to the circuit layout from the sample object lifetimes according to the reliability connectivity of the associated objects in the integrated circuit design.

36. A computer apparatus according to claim 35 wherein said means for generating a prediction of the reliability of integrated circuits comprises:

means for generating sample integrated circuit lifetimes from the sample object lifetimes according to the reliability connectivity of the associated objects.

37. A computer apparatus according to claim 35 wherein said means for identifying an accelerated life defect influence model comprises means for identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein β represents a distribution parameter, wherein ζ represents a defect influence, and wherein ε represents an unobservable random variable uncorrelated with ζ; and wherein said means for generating sample object lifetimes comprises means for generating a sample object lifetime corresponding to the at least one sample object defect from the defect magnitude of the at least one sample object defect according to the corresponding log-linear regression model.

38. A computer apparatus according to claim 37:

wherein said means for identifying a log-linear regression model comprises means for identifying a deterministic object lifetime function relating the defect magnitude of a sample object defect to one object lifetime value; and wherein said means for generating a sample object lifetime corresponding to the at least one sample object defect comprises means for computing a sample object lifetime corresponding to the at least one sample object defect from the defect magnitude of the at least one sample object defect according to the deterministic object lifetime function to thereby generate a sample object lifetime for the at least one sample object defect.

39. A computer apparatus according to claim 37:

wherein said means for identifying a log-linear regression model comprises means for identifying a log-linear object lifetime distribution relating the defect magnitude of a sample object defect to a plurality of object lifetime values; and wherein said means for generating a sample object lifetime corresponding to the at least one sample object defect comprises means for sampling the log-linear object lifetime distribution to thereby generate a sample object lifetime corresponding to the at least one sample object defect.

40. A computer apparatus according to claim 37:

wherein said means for identifying a log-linear regression model comprises means for identifying a predetermined generalized parametric object lifetime distribution function derived from intrinsic reliability data and having a distribution parameter related to the defect magnitude of a sample object defect by a distribution parameter function; and wherein said means for generating a sample object lifetime corresponding to the at least one sample object defect comprises:

means for computing a value for the distribution parameter for the at least one sample object defect from the defect magnitude of the at least one sample object defect according to the distribution parameter function to thereby define a particularized object lifetime distribution function for the at least one sample object defect; and means for sampling the particularized object lifetime distribution function to thereby generate a sample object lifetime corresponding to the at least one sample object defect.

41. A computer apparatus according to claim 37:

wherein said means for identifying a log-linear regression model comprises means for identifying a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized parametric object lifetime distribution function; and wherein said means for generating a sample object lifetime corresponding to the at least one sample object defect comprises:

means for computing a value for the distribution parameter for the at least one sample object defect from the defect magnitude of the at least one sample object defect and the conditional probability factor according to the distribution parameter function to thereby define a particularized object lifetime distribution function for the at least one sample object defect; and means for sampling the particularized object lifetime distribution function to thereby generate a sample object lifetime corresponding to the at least one sample object defect.

42. A computer apparatus according to claim 35:

wherein said means for identifying an accelerated life defect influence model for each sample object defect comprises:

means for identifying a deterministic object lifetime function relating the defect magnitude of a first sample object defect to one object lifetime value, for the first sample object defect; and means for identifying an object lifetime distribution relating the defect magnitude of a second sample object defect to a plurality of object lifetime values, for the second sample object defect; and wherein said means for generating sample object lifetimes comprises:

means for computing an object lifetime value from the defect magnitude of the at least one sample object defect according to the deterministic object lifetime function to thereby generate a sample object lifetime corresponding to the first sample object defect; and means for sampling the object lifetime relating to the defect magnitude of the second sample object defect to thereby generate a sample object lifetime corresponding to the second sample object defect.

43. A computer apparatus according to claim 35:

wherein said means for identifying objects from the circuit layout comprises:

means for identifying cells from the circuit layout, each of the cells occupying an area of the circuit layout and having a reliability connectivity in the integrated circuit design; and means, responsive to said means for identifying cells, for identifying objects within each cell, each of the objects within a cell having a location in the cell and a reliability connectivity in the cell;

wherein said means for generating sample object defects comprises means for generating sample object defects for objects within the cells;

wherein said means for generating sample object lifetimes comprises means for generating sample object lifetimes for objects within the cells; and wherein said means for generating a prediction of the reliability of integrated circuits comprises:

means for generating sample cell lifetimes for cells from the sample object lifetimes for objects within the cells according to the reliability connectivity of the associated objects in the cells; and means, responsive to said means for generating sample cell lifetimes, for generating a prediction of the reliability of integrated circuits produced by the integrated circuit fabrication process from the sample cell lifetimes according to the reliability connectivity of the associated cells in the integrated circuit design.

44. A computer apparatus for predicting defect-related failures in integrated circuits produced by an integrated circuit fabrication process according to a circuit layout for an integrated circuit design, the apparatus comprising:

means for storing the circuit layout;

means, responsive to said means for storing the circuit layout, for identifying objects in the circuit layout, each object having an object type, a location and a reliability connectivity in the integrated circuit design;

means for storing a process flaw distribution associated with the integrated circuit fabrication process, the process flaw distribution representing a statistical distribution of flaws produced by the integrated circuit fabrication process;

means, responsive to said means for storing a process flaw distribution, for generating sample flaws according to the process flaw distribution, each of the sample flaws having a location with respect to the circuit layout;

means, responsive to said means for identifying objects and to said means for generating sample flaws, for correlating the locations of the sample flaws with the locations of the identified objects to thereby generate sample object defects, each sample object defect representing a defect induced in an object by a sample flaw, each sample object defect having a defect magnitude associated therewith;

means, responsive to said means for generating sample object defects, for identifying an accelerated life defect influence model for each sample object defect, each accelerated life defect influence model representing an influence of the defect magnitude of a defect on the lifetime of an object;

means, responsive to said means for generating sample object defects and to said means for identifying a log-linear accelerated life defect influence model, for generating sample object lifetimes for the identified objects from the defect magnitudes associated with sample object defects according to the corresponding identified accelerated life defect influence models; and means, responsive to said means for generating sample object lifetimes, for generating a prediction of the reliability of integrated circuits produced by the integrated circuit fabrication process according to the circuit layout, from the sample object lifetimes according to the reliability connectivity of the associated identified objects in the integrated circuit design.

45. A computer apparatus according to claim 44 wherein said means for generating sample flaws comprises means for sampling the process flaw distribution.

46. A computer apparatus according to claim 44 wherein the process flaw distribution comprises at least at least one of a process flaw magnitude distribution, a process flaw spatial distribution, and a process flaw quantity distribution.

47. A computer apparatus according to claim 44 wherein the process flaw distribution comprises a process flaw magnitude distribution, a process flaw spatial distribution, and a process flaw quantity distribution.

48. A computer apparatus according to claim 44:

wherein said means for identifying objects comprises means for identifying objects having a critical area associated therewith;

wherein said means for generating sample flaws comprises means for generating sample flaws having a location and an area; and wherein said means for correlating the locations of sample flaws with the locations of the identified objects comprises means for generating a sample object defect if a critical area of an object intersects the area of a sample flaw.

49. A computer apparatus according to claim 44 wherein said means for identifying an accelerated life defect influence model comprises means for identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein $\epsilon$ represents an unobservable random variable uncorrelated with $\zeta$; and wherein said means for generating sample object lifetimes comprises means for generating a sample object lifetime corresponding to the at least one sample object defect from the defect magnitude of the at least one sample object defect according to the corresponding log-linear regression model.

50. A computer apparatus according to claim 49:

wherein said means for identifying a log-linear regression model comprises means for identifying a deterministic object lifetime function relating the defect magnitude of a sample object defect to one object lifetime value; and wherein said means for generating a sample object lifetime corresponding to the at least one sample object defect comprises means for computing a sample object lifetime corresponding to the at least one sample object defect from the defect magnitude of the at least one sample object defect according to the deterministic object lifetime function to thereby generate a sample object lifetime for the at least one sample object defect.

51. A computer apparatus according to claim 49:

wherein said means for identifying a log-linear regression model comprises means for identifying a log-linear object lifetime distribution relating the defect magnitude of a sample object defect to a plurality of object lifetime values; and wherein said means for generating a sample object lifetime corresponding to the at least one sample object defect comprises means for sampling the log-linear object lifetime distribution to thereby generate a sample object lifetime corresponding to the at least one sample object defect.

52. A computer apparatus according to claim 49:

wherein said means for identifying a log-linear regression model comprises means for identifying a predetermined generalized parametric object lifetime distribution function derived from intrinsic reliability data and having a distribution parameter related to the defect magnitude of a sample object defect by a distribution parameter function; and wherein said means for generating a sample object lifetime corresponding to the at least one sample object defect comprises:

means for computing a value for the distribution parameter for the at least one sample object defect from the defect magnitude of the at least one sample object defect according to the distribution parameter function to thereby define a particularized object lifetime distribution function for the at least one sample object defect; and means for sampling the particularized object lifetime distribution function to thereby generate a sample object lifetime corresponding to the at least one sample object defect.

53. A computer apparatus according to claim 49:

wherein said means for identifying a log-linear regression model comprises means for identifying a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized parametric object lifetime distribution factor; and wherein said means for generating a sample object lifetime corresponding to the at least one sample object defect comprises:

means for computing a value for the distribution parameter for the at least one sample object defect from the defect magnitude of the at least one sample object defect and the conditional probability factor according to the distribution parameter function to thereby define a particularized object lifetime distribution function for the at least one sample object defect; and means for sampling the particularized object lifetime distribution function to thereby generate a sample object lifetime corresponding to the at least one sample object defect.

54. A computer apparatus according to claim 44:

wherein said means for identifying an accelerated life defect influence model for each sample object defect comprises:

means for identifying a deterministic object lifetime function relating the defect magnitude of a first sample object defect to one object lifetime value, for the first sample object defect; and means for identifying an object lifetime distribution relating the defect magnitude of a second sample object defect to a plurality of object lifetime values, for the second sample object defect; and wherein said means for generating sample object lifetimes comprises:

means for computing an object lifetime value from the defect magnitude of the at least one sample object defect according to the deterministic object lifetime function to thereby generate a sample object lifetime corresponding to the first sample object defect; and means for sampling the object lifetime relating to the defect magnitude of the second sample object defect to thereby generate a sample object lifetime corresponding to the second sample object defect.

55. A computer apparatus according to claim 44:

wherein said means for identifying objects from the circuit layout comprises:

means for identifying cells from the circuit layout, each of the cells occupying an area of the circuit layout and having a reliability connectivity in the integrated circuit design; and means, responsive to said means for identifying cells, for identifying objects within each cell, each of the objects within a cell having a location in the cell and a reliability connectivity in the cell;

wherein said means for generating sample object defects comprises means for generating sample object defects for objects within the cells;

wherein said means for generating sample object lifetimes comprises means for generating sample object lifetimes for objects within the cells; and wherein said means for generating a prediction of the reliability of integrated circuits comprises:

means for generating sample cell lifetimes for cells from the sample object lifetimes for objects within the cells according to the reliability connectivity of the associated objects in the cells; and means, responsive to said means for generating sample cell lifetimes, for generating a prediction of the reliability of integrated circuits produced by the integrated circuit fabrication process from the sample cell lifetimes according to the reliability connectivity of the associated cells in the integrated circuit design.

56. A computer program product for use with a computer-based reliability simulator to produce a sample object lifetime for an object in a circuit layout of an integrated circuit design for a sample object defect in the object according to an accelerated life defect influence model for the sample object defect, the sample object defect having a defect magnitude, the accelerated life defect influence model relating the lifetime of the object to the defect magnitude of the sample object defect, the computer program product comprising:

a computer-readable storage medium having computer-readable program code means embodied in said medium, said computer-readable program code means comprising:

computer-readable program code means for generating a sample object lifetime from the stored defect magnitude according to the accelerated life defect influence model.

57. A computer program product according to claim 56 wherein the accelerated life defect influence model is a log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein $\epsilon$ represents an unobservable random variable uncorrelated with $\zeta$, and wherein said first computer-readable program code means comprises:

second computer-readable program code means for generating a sample object lifetime corresponding to the sample object defect from the defect magnitude of the sample object defect according to the log-linear regression model.

58. A computer program product according to claim 57, wherein the log-linear regression model comprises a deterministic object lifetime function relating the defect magnitude of a sample object defect to one object lifetime value, and wherein said second computer-readable program code means comprises:

computer-readable program code means for computing a sample object lifetime corresponding to the sample object defect from the defect magnitude of the sample object defect according to the deterministic object lifetime function to thereby generate a sample object lifetime for the sample object defect.

59. A computer program product according to claim 51, wherein the log-linear regression model comprises a log-linear object lifetime distribution relating the defect magnitude of a sample object defect to a plurality of object lifetime values, and wherein said second computer-readable program code means comprises:

computer-readable program code means for sampling the log-linear object lifetime distribution to thereby generate a sample object lifetime corresponding to the sample object defect.

60. A computer program product according to claim 57, wherein the log-linear regression model comprises a predetermined generalized parametric object lifetime distribution function derived from intrinsic reliability data and having a distribution parameter related to the defect magnitude of a sample object defect by a distribution parameter function, and wherein said second computer-readable program code means comprises:

computer-readable program code means for computing a value for the distribution parameter for the sample object defect from the defect magnitude of the sample object defect according to the distribution parameter function to thereby define a particularized object lifetime distribution function for the sample object defect; and computer-readable program code means for sampling the particularized object lifetime distribution function to thereby generate a sample object lifetime corresponding to the sample object defect.

61. A computer program product according to claim 57, wherein the log-linear regression model is a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized object lifetime distribution function; and wherein said second computer-readable program code means comprises:

computer-readable program code means for computing a value for the distribution parameter for the sample object defect from the defect magnitude of the sample object defect and the conditional probability factor according to the distribution parameter function to thereby define a particularized object lifetime distribution function for the sample object defect; and computer-readable program code means for sampling the particularized object lifetime distribution function to thereby generate a sample object lifetime corresponding to the sample object defect.

62. A computer program product, comprising:

a computer-readable storage medium having computer-readable program code means embodied in said medium, said computer-readable program code means comprising:

first computer-readable program code means for storing a circuit layout for an integrated circuit design;

second computer-readable program code means, responsive to said first computer-readable program code means, for identifying objects in the circuit layout, each object having a location in the circuit layout and a reliability connectivity in the integrated circuit design;

third computer-readable program code means for storing a process flaw distribution associated with the integrated circuit fabrication process, the process flaw distribution representing a statistical distribution of flaws produced by the integrated circuit fabrication process;

fourth computer-readable program code means, responsive to said third computer-readable program code means, for generating sample flaws according to the process flaw distribution, each of the sample flaws having a location with respect to the circuit layout;

fifth computer-readable program code means, responsive to said second and fourth computer-readable program code means, for correlating the locations of the sample flaws with the locations of the identified objects to thereby generate sample object defects, each sample object defect representing a defect induced in an object by an integrated circuit fabrication process producing integrated circuits according to the circuit layout, each sample object defect having a defect magnitude associated therewith;

sixth computer-readable program code means, responsive to said fifth computer-readable computer program code means, for identifying an accelerated life defect influence model for each sample object defect, each accelerated life defect influence model relating the lifetime of an object to the defect magnitude of a defect in the object;

seventh computer-readable program code means, responsive to said fifth and sixth computer-readable program code means, for generating sample object lifetimes from the defect magnitudes associated with the sample object defects according to the corresponding identified accelerated life defect influence models; and eighth computer-readable program code means, responsive to seventy computer-readable program code means, for generating a prediction of the reliability of integrated circuits produced by the integrated circuit fabrication process according to the circuit layout from the sample object lifetimes according to the reliability connectivity of the associated objects in the integrated circuit design.

63. A computer program product according to claim 62:

wherein said sixth computer-readable program code means comprises:

computer-readable program code means for identifying a deterministic object lifetime function relating the defect magnitude of a first sample object defect to one object lifetime value, for the first sample object defect; and computer-readable program code means for identifying an object lifetime distribution relating the defect magnitude of a second sample object defect to a plurality of object lifetime values, for the second sample object defect; and wherein said seventh computer-readable program code means comprises:

computer-readable program code means for computing an object lifetime value from the defect magnitude of the at least one sample object defect according to the deterministic object lifetime function to thereby generate a sample object lifetime corresponding to the first sample object defect; and computer-readable program code means for sampling the object lifetime relating to the defect magnitude of the second sample object defect to thereby generate a sample object lifetime corresponding to the second sample object defect.

64. A computer program product according to claim 62:

wherein said second computer-readable program code means comprises:

ninth computer-readable program code means for identifying cells from the circuit layout, each of the cells occupying an area of the circuit layout and having a reliability connectivity in the integrated circuit design;

tenth computer-readable program code means, responsive to said seventh computer-readable program code means, for identifying objects within each cell, each of the objects within a cell having a location in the cell and a reliability connectivity in the cell; and wherein said fifth computer-readable program code means comprises computer-readable program code means for generating sample object defects for objects within the cells;

wherein said seventh computer-readable program code means comprises computer-readable program code means for generating sample object lifetimes for objects within the cells; and wherein said eighth computer-readable program code means comprises:

eleventh computer-readable program code means for generating sample cell lifetimes for cells from the sample object lifetimes for objects within the cells according to the reliability connectivity of the associated objects in the cells; and twelfth computer-readable program code means, responsive to said eleventh computer-readable program code means, for generating a prediction of the reliability of integrated circuits produced by the integrated circuit fabrication process from the sample cell lifetimes according to the reliability connectivity of the associated cells in the integrated circuit design.

65. A computer program product according to claim 62 wherein said fourth computer-readable program code means comprises computer-readable program code means for sampling the process flaw distribution.

66. A computer program product according to claim 62 wherein the process flaw distribution comprises at least at least one of a process flaw magnitude distribution, a process flaw spatial distribution, and a process flaw quantity distribution.

67. A computer program product according to claim 62 wherein the process flaw distribution comprises a process flaw magnitude distribution, a process flaw spatial distribution, and a process flaw quantity distribution.

68. A computer program product according to claim 62:

wherein said second computer-readable program code means comprises computer-readable program code means for identifying objects having a critical area associated therewith;

wherein said fourth computer-readable program code means comprises computer-readable program code means for generating sample flaws having a location and an area; and wherein said fifth computer-readable program code means comprises computer-readable program code means for generating a sample object defect if a critical area of an object intersects the area of a sample flaw.

69. A computer program product according to claim 62 wherein said sixth computer-readable program code means comprises ninth computer-readable program code means for identifying a log-linear regression model for at least one of the sample object defects, the log-linear regression model having the form $$\ln T = \mu_0 - \beta^T \zeta + \epsilon,$$

wherein T represents an object lifetime, wherein $\mu_0$ represents a parameter corresponding to an expected value of an object lifetime, wherein $\beta$ represents a distribution parameter, wherein $\zeta$ represents a defect influence, and wherein ε represents an unobservable random variable uncorrelated with ζ; and wherein said seventh computer-readable program code means comprises tenth computer-readable program code means for generating a sample object lifetime corresponding to the at least one sample object defect from the defect magnitude of the at least one sample object defect according to the corresponding log-linear regression model.

70. A computer program product according to claim 69:

wherein said ninth computer-readable program code means comprises computer-readable program code means for identifying a deterministic object lifetime function relating the defect magnitude of a sample object defect to one object lifetime value; and wherein said tenth computer-readable program code means comprises computer-readable program code means for computing a sample object lifetime corresponding to the at least one sample object defect from the defect magnitude of the at least one sample object defect according to the deterministic object lifetime function to thereby generate a sample object lifetime for the at least one sample object defect.

71. A computer program product according to claim 69:

wherein said ninth computer-readable program code means comprises computer-readable program code means for identifying a log-linear object lifetime distribution relating the defect magnitude of a sample object defect to a plurality of object lifetime values; and wherein said tenth computer-readable program code means comprises computer-readable program code means for sampling the log-linear object lifetime distribution to thereby generate a sample object lifetime corresponding to the at least one sample object defect.

72. A computer program product according to claim 69:

wherein said ninth computer-readable program code means comprises computer-readable program code means for identifying a predetermined generalized parametric object lifetime distribution function derived from intrinsic reliability data and having a distribution parameter related to the defect magnitude of a sample object defect by a distribution parameter function; and wherein said tenth computer-readable program code means comprises:

computer-readable program code means for computing a value for the distribution parameter for the at least one sample object defect from the defect magnitude of the at least one sample object defect according to the distribution parameter function to thereby define a particularized object lifetime distribution function for the at least one sample object defect; and computer-readable program code means for sampling the particularized object lifetime distribution function to thereby generate a sample object lifetime corresponding to the at least one sample object defect.

73. A computer program product according to claim 69:

wherein said ninth computer-readable program code means comprises computer-readable program code means for identifying a predetermined generalized parametric object lifetime distribution function derived from intrinsic reliability data and having a distribution parameter related to the defect magnitude of a sample object defect and a conditional probability factor by a distribution parameter function, the conditional probability factor being independent of the predetermined generalized parametric object lifetime distribution function; and wherein said tenth computer-readable program code means comprises:

computer-readable program code means for computing a value for the distribution parameter for the at least one sample object defect from the defect magnitude of the at least one sample object defect and the conditional probability factor according to the distribution parameter function to thereby define a particularized object lifetime distribution function for the at least one sample object defect; and computer-readable program code means for sampling the particularized object lifetime distribution function to thereby generate a sample object lifetime corresponding to the at least one sample object defect.

\* \* \* \* \*

UNITED STATES PATENT AND TRADEMARK OFFICE
CERTIFICATE OF CORRECTION

PATENT NO. : 5,822,218
DATED : October 13, 1998
INVENTOR(S) : Mohamed S. Moosa, Kelvin F. Poole It is certified that error appears in the above-identified patent and that said Letters Patent is hereby corrected as shown below:

TITLE PAGE:

Under paragraph entitled "References Cited", Moosa et al.:
Delete "Stimulator" and substitute --Simulator -- therefor.

Add the following patent references:
```
"5,675,521      10/1997    Holzhauer et al.    364/578
 4,520,448       5/1985    Tremintin           364/488
 5,475,695      12/1995    Caywood et al.      371/27
 5,519,633       5/1996    Chang et al.        364/491
 5,287,284       2/1994    Sugino et al.       364/468
 5,291,419       3/1994    Satoh et al.        364/508"
```

Column 43, Line 62   Delete "51" and substitute -- 57 -- therefor.

Signed and Sealed this

Sixteenth Day of March, 1999

*Attest:*

Q. TODD DICKINSON

*Attesting Officer*     *Acting Commissioner of Patents and Trademarks*